(12) United States Patent
Matsuda et al.

(10) Patent No.: US 9,981,292 B2
(45) Date of Patent: *May 29, 2018

(54) PIEZOELECTRIC MATERIAL, PIEZOELECTRIC ELEMENT, METHOD FOR MANUFACTURING PIEZOELECTRIC ELEMENT, AND ELECTRONIC DEVICE

(71) Applicant: CANON KABUSHIKI KAISHA, Tokyo (JP)

(72) Inventors: Takanori Matsuda, Chofu (JP); Takayuki Watanabe, Yokohama (JP); Shunsuke Murakami, Kawasaki (JP); Hiroshi Saito, Kawasaki (JP); Tatsuo Furuta, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 188 days.

This patent is subject to a terminal disclaimer.

(21) Appl. No.: 14/723,870

(22) Filed: May 28, 2015

(65) Prior Publication Data
US 2015/0349238 A1 Dec. 3, 2015

(30) Foreign Application Priority Data

May 30, 2014 (JP) ................. 2014-113121

(51) Int. Cl.
| | | |
|---|---|---|
| H01L 41/00 | (2013.01) | |
| B08B 7/02 | (2006.01) | |
| G02B 7/10 | (2006.01) | |
| G02B 27/00 | (2006.01) | |
| B41J 2/14 | (2006.01) | |
| B41J 2/16 | (2006.01) | |
| H01L 41/43 | (2013.01) | |
| H01L 41/187 | (2006.01) | |
| H01L 41/257 | (2013.01) | |
| H01L 41/273 | (2013.01) | |
| H01L 41/047 | (2006.01) | |
| H02N 2/10 | (2006.01) | |

(52) U.S. Cl.
CPC ............ *B08B 7/02* (2013.01); *B41J 2/14233* (2013.01); *B41J 2/14274* (2013.01); *B41J 2/161* (2013.01); *B41J 2/1612* (2013.01); *B41J 2/1632* (2013.01); *B41J 2/1637* (2013.01); *B41J 2/1642* (2013.01); *B41J 2/1646* (2013.01); *G02B 7/10* (2013.01); *G02B 27/0006* (2013.01); *H01L 41/1871* (2013.01); *H01L 41/257* (2013.01); *H01L 41/273* (2013.01); *H01L 41/43* (2013.01); *B41J 2202/03* (2013.01); *H01L 41/0471* (2013.01); *H02N 2/103* (2013.01); *Y10T 29/43* (2015.01)

(58) Field of Classification Search
CPC ..... B08B 7/02; H01L 41/1871; H01L 41/257; H01L 41/273; G02B 7/01; G02B 27/0006; B41J 2/14233; B41J 2/14274; B41J 2/161; B41J 2/1612; B41J 2/1632; B41J 2/1637; B41J 2/1642
See application file for complete search history.

(56) References Cited

U.S. PATENT DOCUMENTS

| | | | | |
|---|---|---|---|---|
| 3,704,266 A | * | 11/1972 | Ueoka et al. ....... | C04B 35/4682 252/520.21 |
| 8,547,001 B2 | | 10/2013 | Saito et al. | |
| 8,714,712 B2 | | 5/2014 | Hamada | |
| 2010/0220427 A1 | | 9/2010 | Symes, Jr. et al. | |
| 2011/0164331 A1 | | 7/2011 | Sugiyama | |
| 2011/0216130 A1 | | 9/2011 | Hamada | |
| 2011/0298336 A1 | | 12/2011 | Saito | |
| 2012/0033343 A1 | | 2/2012 | Yoon et al. | |
| 2012/0038714 A1 | | 2/2012 | Harigai et al. | |

FOREIGN PATENT DOCUMENTS

| | | |
|---|---|---|
| CN | 103283051 A | 9/2013 |
| CN | 103650323 A | 3/2014 |
| EP | 2178131 A2 | 4/2010 |
| EP | 2251313 A1 | 11/2010 |
| JP | H11-060334 A | 3/1999 |
| JP | 5217997 B2 | 6/2013 |
| JP | 5344456 B2 | 11/2013 |
| TW | 514594 B | 12/2002 |
| TW | 1278132 B | 4/2007 |
| TW | 201341338 A | 10/2013 |

(Continued)

OTHER PUBLICATIONS

U.S. Appl. No. 14/723,963, filed May 28, 2015.
U.S. Appl. No. 14/724,020, filed May 28, 2015.
Characterization of the BaBiO3 doped BaTiO3 positive temperature coefficient of a resistivity ceramic using impedance spectroscopy, Yuan Chang-Li, Chin. Phys. B, vol. 20, No. 4, pp. 048701-1 to 048701-8 (Apr. 31, 2011).

*Primary Examiner* — C Melissa Koslow
(74) *Attorney, Agent, or Firm* — Canon U.S.A. Inc., IP Division

(57) ABSTRACT

The present invention can provide a lead-free piezoelectric material having a high piezoelectric constant in the room temperature range. The present invention for this purpose is a piezoelectric material including a main component containing a perovskite metal oxide represented by following general formula (1), $$Ba_a(Ti_{1-x}Zr_x)O_3 \qquad (1)$$

where $0.02 \leq x \leq 0.13$ and $0.986 \leq a \leq 1.02$, a first auxiliary component containing Mn, and a second auxiliary component containing trivalent Bi, wherein an amount of the contained Mn is 0.0020 moles or more and 0.0150 moles or less relative to 1 mole of the metal oxide, and an amount of the contained Bi is 0.00042 moles or more and 0.00850 moles or less relative to 1 mole of the metal oxide.

21 Claims, 14 Drawing Sheets

(56) References Cited

FOREIGN PATENT DOCUMENTS

| WO | 2004054931 A1 | 7/2004 |
|----|---------------|--------|
| WO | 2013005701 A1 | 1/2013 |
| WO | 2014/069493 A1 | 5/2014 |

\* cited by examiner

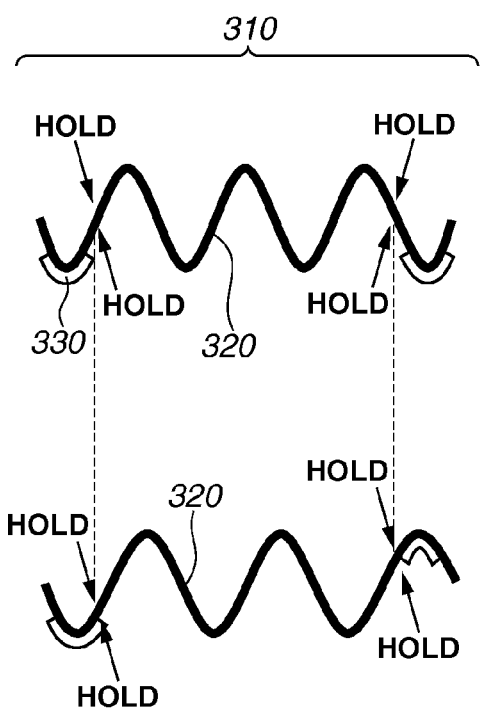
FIG.11A IN PHASE
FIG.11B ANTIPHASE

PIEZOELECTRIC MATERIAL, PIEZOELECTRIC ELEMENT, METHOD FOR MANUFACTURING PIEZOELECTRIC ELEMENT, AND ELECTRONIC DEVICE

BACKGROUND OF THE INVENTION

Field of the Invention

The present invention relates to a piezoelectric material, and in particular, relates to a lead-free piezoelectric material, which does not contain lead. The present invention also relates to a piezoelectric element, a multilayered piezoelectric element, a liquid discharge head, a liquid discharge apparatus, an ultrasonic motor, an optical device, an oscillatory device, a dust removing device, an imaging apparatus, and an electronic device that use the piezoelectric material, and a method for manufacturing the piezoelectric element.

Description of the Related Art

Generally, a piezoelectric material is an $ABO_3$-type perovskite metal oxide such as lead zirconium titanate (hereinafter referred to as "PZT"). PZT, however, contains lead as an A-site element, and therefore, the environmental impact of PZT is regarded as a problem. Thus, there is a need for a piezoelectric material using a perovskite metal oxide that does not contain lead.

As a piezoelectric material using a perovskite metal oxide that does not contain lead, barium titanate is known. Further, to improve the properties of the piezoelectric material, a material is developed based on the composition of barium titanate.

Japanese Patent Application Laid-Open No. 11-060334 discusses a material of which the piezoelectric properties (the piezoelectric constant) are improved by replacing a part of the B site of barium titanate with Zr to raise a phase transition temperature $T_{to}$ to the room temperature range, and using a local maximum in the dielectric constant due to a phase transition.

To drive a high-power actuator, however, if room temperature is set to 25° C. and the room temperature range is set to, for example, 20° C. to 30° C., the piezoelectric properties of the piezoelectric material discussed in Japanese Patent Application Laid-Open No. 11-060334 are not sufficient within the room temperature range. Generally, the piezoelectric properties (the piezoelectric constant) increase near the phase transition temperature. In the case of the piezoelectric material discussed in Japanese Patent Application Laid-Open No. 11-060334, even if the amount of contained Zr is adjusted to shift the phase transition temperature of the piezoelectric material to near room temperature, the piezoelectric properties are still insufficient.

SUMMARY OF THE INVENTION

Aspects of the present invention are directed to a lead-free piezoelectric material having more excellent piezoelectric properties when the phase transition temperature $T_{to}$ is in the room temperature range.

According to an aspect of the present invention, a piezoelectric material includes a main component containing a perovskite metal oxide represented by following general formula (1), $$Ba_a(Ti_{1-x}Zr_x)O_3 \quad (1)$$

where $0.02 \leq x \leq 0.13$ and $0.986 \leq a \leq 1.02$ a first auxiliary component containing Mn, and a second auxiliary component containing trivalent Bi, wherein an amount of the contained Mn is 0.0020 moles or more and 0.0150 moles or less relative to 1 mole of the metal oxide, and an amount of the contained Bi is 0.00042 moles or more and 0.00850 moles or less relative to 1 mole of the metal oxide.

In the above piezoelectric material, a tetragonal-orthorhombic phase transition temperature $T_{to}$ is 10° C. or more.

According to another aspect of the present invention, a piezoelectric element includes at least a first electrode, a piezoelectric material portion, and a second electrode, wherein a piezoelectric material forming the piezoelectric material portion is the above piezoelectric material.

According to yet another aspect of the present invention, a method for manufacturing a piezoelectric element includes providing the piezoelectric material with a first electrode and a second electrode, applying a voltage at a temperature at which the piezoelectric material becomes tetragonal, and cooling the piezoelectric material to a temperature at which the piezoelectric material becomes orthorhombic, while retaining the voltage.

According to yet another aspect of the present invention, a multilayered piezoelectric element includes a plurality of piezoelectric material layers and a plurality of electrode layers including an internal electrode, the piezoelectric material layers and the electrode layers being alternately stacked, wherein a piezoelectric material is the above piezoelectric material.

According to yet another aspect of the present invention, a liquid discharge head includes at least a liquid chamber including a vibrating unit provided with the above piezoelectric element or the above multilayered piezoelectric element, and a discharge port communicating with the liquid chamber.

According to yet another aspect of the present invention, a liquid discharge apparatus includes a stage for an object, and the above liquid discharge head.

According to yet another aspect of the present invention, an ultrasonic motor includes at least a vibrating member provided with the above piezoelectric element or the above multilayered piezoelectric element, and a moving member in contact with the vibrating member.

According to yet another aspect of the present invention, an optical device includes a driving unit provided with the above ultrasonic motor.

According to yet another aspect of the present invention, an oscillatory device includes a vibrating member including a diaphragm provided with the above piezoelectric element or the above multilayered piezoelectric element.

According to yet another aspect of the present invention, a dust removing device includes a vibrating unit provided with the above oscillatory device.

According to yet another aspect of the present invention, an imaging apparatus includes at least the above dust removing device, and an image sensor unit, wherein the diaphragm of the dust removing device is provided on a light-receiving surface side of the image sensor unit.

According to yet another aspect of the present invention, an electronic device includes a piezoelectric acoustic component provided with the above piezoelectric element or the above multilayered piezoelectric element.

Further features of the present invention will become apparent from the following description of exemplary embodiments with reference to the attached drawings.

BRIEF DESCRIPTION OF THE DRAWINGS

FIGS. 11A and 11B are schematic diagrams illustrating an oscillation principle of a dust removing device according to an exemplary embodiment of the present invention.

DESCRIPTION OF THE EMBODIMENTS

Figure 1:
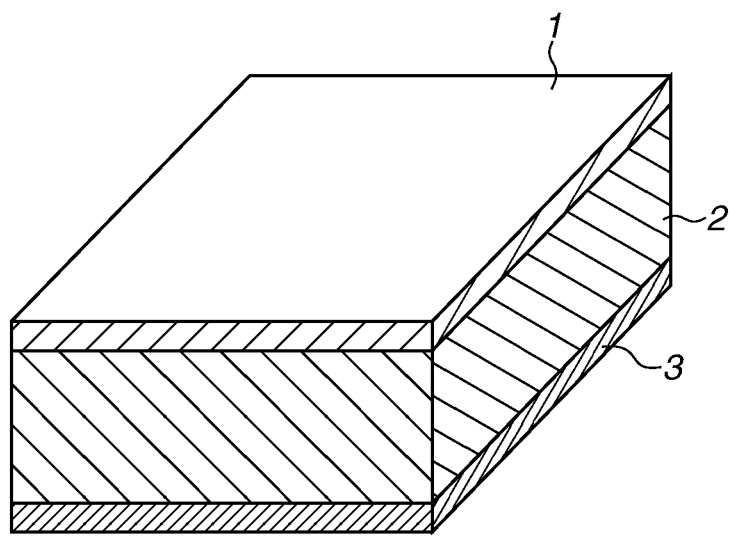
FIG. 1 is a schematic diagram illustrating a configuration of a piezoelectric element according to an exemplary embodiment of the present invention.

Exemplary embodiments for carrying out the present invention will be described below.

A piezoelectric material according to the present invention is a piezoelectric material including a main component containing a perovskite metal oxide represented by the following general formula (1), a first auxiliary component containing Mn, and a second auxiliary component containing trivalent Bi. Further, the amount of the contained Mn is 0.0020 moles or more and 0.0150 moles or less relative to 1 mole of the metal oxide, and the amount of the contained Bi is 0.00042 moles or more and 0.00850 moles or less relative to 1 mole of the metal oxide.

$$Ba_a(Ti_{1-x}Zr_x)O_3 \quad (1)$$

(where $0.02 \leq x \leq 0.13$ and $0.986 \leq a \leq 1.02$)
(Perovskite Metal Oxide)

In the present invention, a "perovskite metal oxide" refers to a metal oxide having a perovskite structure, which is ideally a cubic structure, as discussed in the fifth edition of Iwanami Rikagaku Jiten (issued on Feb. 20, 1998 by Iwanami Shoten, Publishers). Generally, a metal oxide having a perovskite structure is represented by a chemical formula $ABO_3$. In the perovskite metal oxide, the elements A and B in the forms of ions occupy particular unit cell positions termed an A site and a B site, respectively. For example, in a cubic structure unit cell, the element A occupies the vertices of the cube, and the element B occupies the body-centered position of the cube. The element O occupies the face-centered positions of the cube as anions of oxygen.

In the metal oxide represented by the general formula (1), a metallic element positioned at the A site is Ba, and metallic elements positioned at the B site are Ti and Zr. A part of Ba, however, may be positioned at the B site. Similarly, a part of Ti and Zr may be positioned at the A site.

In the general formula (1), the molar ratio of the B-site elements to the element O is 1:3. However, even if the ratio of the amounts of the elements slightly deviates from the above molar ratio, such a deviating ratio is included in the scope of the present invention so long as the main phase of the metal oxide is a perovskite structure.

It is possible to determine that the metal oxide has a perovskite structure, for example, by a structure analysis using X-ray diffraction or electron diffraction. If the main phase of the metal oxide is a perovskite structure, a large portion of the results of the structure analysis is made up of analysis data derived from the perovskite structure.

(Main Component of Piezoelectric Material)

In the piezoelectric material according to the present invention, in the general formula (1), "a" indicating the ratio of the molar amount of Ba at the A site to the molar amount of Ti and Zr at the B site is in the range of $0.9860 \leq a \leq 1.0200$.

The piezoelectric material contains preferably 90 mole percent or more, and more preferably 95 mole percent or more, of the perovskite metal oxide represented by the general formula (1), as the main component.

If "a" is smaller than 0.9860, abnormal grain growth is likely to occur in the crystal grains forming the piezoelectric material, and the mechanical strength of the material decreases. If, on the other hand, "a" is greater than 1.0200, the temperature required for grain growth is too high. Thus, the piezoelectric material cannot be sintered in a general burning furnace. Here, "the piezoelectric material cannot be sintered" means that the density does not reach a sufficient value, or many pores and defects are present in the piezoelectric material.

In the general formula (1), "x" indicating the molar proportion of Zr at the B site is in the range of $0.02 \leq x \leq 0.13$. If "x" is greater than 0.13, the Curie temperature is too low, and the high-temperature durability is not sufficient. If "x" is smaller than 0.02, sufficient piezoelectric properties are not obtained in the temperature range for driving the device (−30° C. to 50° C.)

In the specification, the "Curie temperature ($T_c$)" refers to the temperature at which the ferroelectricity of the material disappears. Normally, the piezoelectric properties of the piezoelectric material also disappear at the Curie temperature $T_c$ or above. Examples of the method for measuring the Curie temperature $T_c$ include a method for directly measuring the temperature at which the ferroelectricity disappears, while changing the measurement temperature, and a method for measuring the relative dielectric constant while changing the measurement temperature using a minute alternating electric field, thereby obtaining the Curie temperature $T_c$ from the temperature at which the relative dielectric constant indicates a local maximum.

The method for measuring the composition of the piezoelectric material according to the present invention is not particularly limited. Examples of the method include an X-ray fluorescence analysis (XRF), an inductively coupled plasma (ICP) emission spectroscopic analysis, and an atomic absorption spectrometry. Any of the methods can calculate the weight ratio and the composition ratio of the elements contained in the piezoelectric material.
(First Auxiliary Component of Piezoelectric Material)

The first auxiliary component contains Mn. The amount of the contained Mn is 0.0020 moles or more and 0.0150 moles or less relative to 1 mole of the perovskite metal oxide.

At this time, the amounts of the contained auxiliary components are obtained as follows. First, the amounts of metals contained in the piezoelectric material measured using an XRF, an ICP emission spectroscopic analysis, or an atomic absorption spectrometry are calculated. Then, based on the amounts of the contained metals, the elements forming the metal oxide represented by the general formula (1) are converted into moles and represented by the ratio of the moles of the elements to the moles of the auxiliary components with the total moles of the elements being 1.

If the piezoelectric material according to the present invention contains Mn in the above range, the mechanical quality factor of the piezoelectric material improves in the room temperature range. The "mechanical quality factor" refers to a factor representing elastic loss caused by an oscillation when the piezoelectric material is evaluated as an oscillator, and the value of the mechanical quality factor is observed as the sharpness of a resonance curve in an impedance measurement. That is, the mechanical quality factor is a constant representing the sharpness of the resonance of the oscillator. The higher the mechanical quality factor is, the less the energy is lost by an oscillation. A high insulation properties and a high mechanical quality factor ensure long-term reliability of a piezoelectric element when a piezoelectric element including the piezoelectric material is driven by application of a voltage.

If the amount of the contained Mn is less than 0.0020 moles, the mechanical quality factor is small, namely less than 150, in the room temperature range. If the mechanical quality factor is small, when a piezoelectric element including the piezoelectric material and a pair of electrodes is driven as a resonance device, the power consumption increases. The mechanical quality factor is preferably 200 or more, and more preferably 400 or more. The mechanical quality factor is even more preferably 700 or more. In this range, the power consumption does not extremely increase when the device is driven. If, on the other hand, the amount of the contained Mn is greater than 0.0150 moles, the insulation properties of the piezoelectric material decrease. For example, the dielectric loss tangent, at a frequency of 1 kHz, of the piezoelectric material may exceed 0.006, or the resistivity of the piezoelectric material may fall below 1 GΩ cm. The dielectric loss tangent can be measured using an impedance analyzer. If the dielectric loss tangent is 0.006 or less, it is possible to, even when a high voltage is applied to the piezoelectric material used as an element, obtain a stable operation of the element. If the resistivity of the piezoelectric material is at least 1 GΩ cm, the piezoelectric material can be polarized and driven as a piezoelectric element. The resistivity is more preferably 50 GΩ cm or more.

The Mn is not limited to metallic Mn, and is only required to be contained as an Mn component in the piezoelectric material. The form of containing the Mn does not matter. For example, the Mn may be dissolved in the B site, or may be contained at grain boundaries. Alternatively, an Mn component in the form of a metal, an ion, an oxide, a metallic salt, or a complex may be contained in the piezoelectric material. It is more desirable that Mn should be present in terms of insulation properties and ease of sintering. Generally, the valence of Mn can take 4+, 2+, and 3+. If a conduction electron is present in a crystal (for example, if an oxygen defect is present in a crystal, or if a donor element occupies the A site), the valence of Mn decreases, for example, from 4+ to 3+ or 2+, thereby trapping the conduction electron. This can improve the insulation resistance.

If, on the other hand, the valence of Mn is lower than 4+, such as 2+, the Mn serves as an acceptor. If Mn is present as an acceptor in a perovskite structure crystal, a hole is generated in the crystal, or an oxygen vacancy is formed in the crystal.

If the valence of a large amount of added Mn is 2+ or 3+, the introduction of an oxygen vacancy alone cannot completely compensate for a hole, and the insulation resistance decreases. Thus, it is desirable that the valence of the majority of the Mn should be 4+. However, an extremely small amount of the Mn may have a valence lower than 4+, occupy the B site of the perovskite structure as an acceptor, and form an oxygen vacancy. This is because the Mn having a valence of 2+ or 3+ and the oxygen vacancy form a defect dipole and the mechanical quality factor of the piezoelectric material can be thereby improved. If trivalent Bi occupies the A site, Mn is likely to take a valence lower than 4+ to achieve a charge balance.

The valence of a minute amount of Mn added to a nonmagnetic (diamagnetic) material can be evaluated by measuring the temperature dependence of the magnetic susceptibility. The magnetic susceptibility can be measured by a superconducting quantum interference device (SQUID), a vibrating sample magnetometer (VSM), or a magnetic balance. Generally, a magnetic susceptibility $\chi$ obtained by the measurement follows the Curie-Weiss law represented by formula 2.

$$\chi = C/(T-\theta) \quad \text{(Formula 2)}$$

(C: the Curie constant, $\theta$: the paramagnetic Curie temperature)

Generally, a minute amount of Mn added to a nonmagnetic material indicates spin $S=5/2$ if the valence is 2+, $S=2$ if the valence is 3+, and $S=3/2$ if the valence is 4+. Thus, the Curie constant C per unit amount of Mn is a value corresponding to the value of the spin S with each valence of the Mn. Thus, the Curie constant C is derived from the temperature dependence of the magnetic susceptibility $\chi$, whereby the average valence of Mn in a sample can be evaluated.

To evaluate the Curie constant C, it is desirable to measure the temperature dependence of the magnetic susceptibility from the lowest possible temperature. This is because the amount of Mn is minute, and therefore, the value of the magnetic susceptibility is also very small at a relatively high temperature such as at around room temperature. Thus, it is difficult to measure the temperature dependence. The Curie constant C can be derived from the slope of the straight line obtained by plotting a multiplicative inverse $1/\chi$ of the magnetic susceptibility with respect to a temperature T and linearly approximating the plotted points.
(Second Auxiliary Component of Piezoelectric Material)

The second auxiliary component contains Bi. The amount of the contained Bi is 0.00042 moles or more and 0.00850 moles or less relative to 1 mole of the metal oxide.

If the piezoelectric material according to the present invention contains Bi in the above range, it is considered that a large portion of the trivalent Bi is positioned at the A site, and a portion of the trivalent Bi is positioned at crystal grain boundaries. If the Bi is positioned at the A site, a tetragonal-orthorhombic phase transition temperature $T_{to}$ shifts to a low temperature. This is an action opposite to that caused by the piezoelectric material containing Zr.

Based on the above, although there has been conventionally an upper limit on the amount of Zr required to locate the phase transition temperature $T_{to}$ near room temperature, the addition of Zr together with Bi enables the piezoelectric material to contain more Zr.

Generally, the Curie temperature and the piezoelectric properties (the piezoelectric constant) of a piezoelectric material tend to have a trade-off relationship. The effect of the trade-off relationship is as follows. If the amount of Zr contained in the piezoelectric material increases, the Curie temperature $T_c$ becomes lower than that of pure barium titanate, which does not contain Zr. This improves the piezoelectric properties.

Thus, in the case of piezoelectric materials having the phase transition temperatures $T_{to}$ near the same room temperature, the piezoelectric material containing Bi can contain more Zr than the piezoelectric material that does not contain Bi. Consequently, the piezoelectric material containing Bi has excellent piezoelectric properties near room temperature.

If the amount of the contained Bi is smaller than 0.00042 moles, to improve the piezoelectric properties, the amount of Zr in the material containing the Bi is reduced with a view to bringing the phase transition temperature $T_{to}$ close to room temperature. However, such a material containing a small amount of Zr has a high Curie temperature $T_c$ and a low dielectric constant. Thus, the piezoelectric properties near room temperature are small.

If, on the other hand, the amount of the contained Bi is greater than 0.00850 moles, the solubility limit of Bi in the above perovskite metal oxide is exceeded. Thus, the piezoelectric properties are not sufficient due to the remaining Bi, which is not desirable. In terms of obtaining more desirable mechanical quality factor and piezoelectric constant in the room temperature range, the amount of the contained Bi is more preferably 0.0020 moles or more and 0.00850 moles or less.

The Bi as the second auxiliary component is not limited to metallic Bi, and is only required to be contained as a Bi component in the piezoelectric material. The form of containing the Bi does not matter. It is, however, desirable that the Bi as the second auxiliary component should be dissolved as trivalent Bi in the A site. The valence of the Bi can be identified by the X-ray absorption fine structure (XAFS) measurement using radiation light.

(Third Auxiliary Component of Piezoelectric Material)

It is desirable that the piezoelectric material according to the present invention should include a third auxiliary component containing at least one of Si and B. The amount of the contained third auxiliary component is preferably 0.001 parts by weight or more and 4.000 parts by weight or less, and more preferably 0.003 parts by weight or more and 2.000 parts by weight or less, in terms of metal relative to 100 parts by weight of the perovskite metal oxide represented by the general formula (1).

The third auxiliary component contains at least one of Si and B. B and Si are segregated at the grain boundaries of the piezoelectric material. This reduces a leakage current flowing through the grain boundaries, and therefore increases the resistivity. If the piezoelectric material contains 0.001 or more parts by weight of the third auxiliary component, the resistivity becomes high, and the insulation properties improve, which is desirable. If the piezoelectric material contains more than 4.000 parts by weight of the third auxiliary component, the dielectric constant decreases, and as a result, the piezoelectric properties decrease, which is not desirable. The amount of the contained Si is more preferably 0.003 parts by weight or more and 1.000 parts by weight or less relative to 100 parts by weight of the perovskite metal oxide. The amount of the contained B is more preferably 0.001 parts by weight or more and 1.000 parts by weight or less.

A multilayered piezoelectric element includes a thin piezoelectric material between electrodes, and therefore needs to have durability to a high electric field. Thus, the piezoelectric material according to the present invention excels particularly in its insulation properties, and therefore can be suitably used for a multilayered piezoelectric element.

The piezoelectric material according to the present invention may contain a certain amount of Nb contained as an unavoidable component in a commercial raw material of Ti and a certain amount of Hf contained as an unavoidable component in a commercial raw material of Zr.

The piezoelectric material according to the present invention contains the perovskite metal oxide represented by the general formula (1), the first auxiliary component, the second auxiliary component, and the third auxiliary component preferably in 98.5 mole percent or more in total. As described above, the piezoelectric material contains, as the main component, the perovskite metal oxide represented by the general formula (1) preferably in 90 mole percent or more, and more preferably in 95 mole percent or more.

(Regarding Grain Diameter and Equivalent Circular Diameter of Crystal Grain)

The average equivalent circular diameter of the crystal grains forming the piezoelectric material according to the present invention is preferably 500 nm or more and 10 μm or less. The "average equivalent circular diameter" refers to the average value of the equivalent circular diameters of a plurality of crystal grains. The average equivalent circular diameter of the crystal grains is in this range, whereby the piezoelectric material according to the present invention can have excellent piezoelectric properties and mechanical strength. If the average equivalent circular diameter is less than 500 nm, the piezoelectric properties may not be sufficient. If, on the other hand, the average equivalent circular diameter is greater than 10 μm, the mechanical strength may decrease. The range of the average equivalent circular diameter is more preferably 500 nm or more and 4.5 μm or less.

An "equivalent circular diameter" in the present invention represents a "projected area equivalent circular diameter" generally termed in a microscopic observation method and represents the diameter of a true circle having the same area as the projected area of a crystal grain. In the present invention, the method for measuring the equivalent circular diameter is not particularly limited. The equivalent circular diameter can be obtained by, for example, performing image processing on a photographic image obtained by photographing the surface of the piezoelectric material using a polarizing microscope or a scanning electron microscope (SEM). The optimal magnification varies depending on the target grain diameter. Thus, either an optical microscope or an electron microscope may be appropriately used. The equivalent circular diameter may be obtained not from an image of the surface of the material but from an image of a polished surface or a cross section of the material.

(Regarding Relative Density)

The relative density of the piezoelectric material according to the present invention is preferably 93% or more and 100% or less.

The relative density is the proportion of the theoretical density calculated from the lattice constant of the piezoelectric material and the atomic weights of the constituent elements of the piezoelectric material, to the actually measured density. The lattice constant can be measured by, for example, an X-ray diffraction analysis. The density can be measured by, for example, the Archimedes' principle.

If the relative density is smaller than 93%, the piezoelectric properties or the mechanical quality factor may not be sufficient, or the mechanical strength may decrease.

The relative density of the piezoelectric material according to the present invention is more preferably in the range of 95% or more and 100% or less, and even more preferably in the range of 97% or more and 100% or less.

(Regarding Dielectric Loss Tangent)

The dielectric loss tangent, at a frequency of 1 kHz, of the piezoelectric material according to the present invention is preferably 0.006 or less. The dielectric loss tangent can be measured by applying an alternating electric field having a frequency of 1 kHz and an electric field strength of 10 V/cm, using a commercial impedance analyzer.

(Form of Piezoelectric Material)

The form of the piezoelectric material according to the present invention is not limited. The form may be any of a ceramic, powder, a single crystal, and slurry, but is preferably a ceramic. In the specification, the term "ceramic" represents an aggregate (also referred to as a "bulk body") of crystal grains containing a metal oxide as a basic component and produced by baking through heat treatment, that is, represents a so-called polycrystal. The ceramic includes products processed after sintering.

(Method for Manufacturing Piezoelectric Material)

The method for manufacturing the piezoelectric material according to the present invention is not particularly limited. A typical manufacturing method is described below.

(Raw Materials of Piezoelectric Material)

When the piezoelectric material is manufactured, it is possible to employ a general technique for producing a compact from a solid powder of an oxide, a carbonate, a nitrate, an oxalate, or an acetate that contains constituent elements, and sintering the compact under normal pressure. The raw materials of the piezoelectric material include metal compounds such as a Ba compound, a Ti compound, a Zr compound, an Mn compound, a Bi compound, a B compound, and an Si compound.

Examples of the Ba compound that can be used include barium oxide, barium carbonate, barium oxalate, barium acetate, barium nitrate, barium titanate, and barium zirconate. It is desirable to use a commercially available high-purity type (for example, a purity of 99.99% or more) of each of the Ba compounds.

Examples of the Ti compound that can be used include titanium oxide, barium titanate, and barium zirconate titanate. If an alkaline earth metal such as barium is contained in each of the Ti compounds, it is desirable to use a commercially available high-purity type (e.g., a purity of 99.99% or more) of the Ti compound.

Examples of the Zr compound that can be used include zirconium oxide, barium zirconate, and barium zirconate titanate. If an alkaline earth metal such as barium is contained in each of the Zr compounds, it is desirable to use a commercially available high-purity type (e.g., a purity of 99.99% or more) of the Zr compound.

Examples of the Mn compound that can be used include manganese carbonate, manganese oxide, manganese dioxide, manganese acetate, and trimanganese tetroxide.

Examples of the Bi compound that can be used include bismuth oxide.

Examples of the Si compound that can be used include silicon dioxide.

Examples of the B compound that can be used include boron oxide.

Further, in the piezoelectric material according to the present invention, a raw material for adjusting "a" indicating the ratio of the abundance of Ba at the A site to the molar amount of Ti and Zr at the B site is not particularly limited. Any of a Ba compound, a Ti compound, and a Zr compound has the same effect.

(Granulated Powder and Compact)

The compact is a solid obtained by shaping the solid powder. Examples of the shaping method include uniaxial pressing, cold isostatic pressing, warm isostatic pressing, casting, and extrusion molding. When the compact is prepared, it is desirable to use a granulated powder. The sintering of the compact using a granulated powder has the advantage that the distribution of the sizes of the crystal grains of the sintered body is likely to become uniform. Further, in terms of increasing the insulation properties of the sintered body, it is desirable that the compact should include the third auxiliary component containing at least one of Si and B.

The method for granulating the raw material powder of the piezoelectric material is not particularly limited. In terms of the ability to make the grain diameters of the granulated powder more uniform, it is most desirable to use spray drying as the granulating method.

Examples of a binder that can be used to granulate the raw material powder include polyvinyl alcohol (PVA), polyvinyl butyral (PVB), and an acrylic resin. The amount of the binder to be added is preferably 1 part by weight or more and 10 parts by weight or less relative to 100 parts by weight of the raw material powder of the piezoelectric material, and is more preferably 2 parts by weight or more and 5 parts by weight or less, in terms of increasing the density of the compact.

(Sintering)

The method for sintering the compact is not particularly limited.

Examples of the sintering method include sintering in an electric furnace, sintering in a gas furnace, electrical heating, microwave sintering, millimeter wave sintering, and hot isostatic pressing (HIP). The sintering in an electric furnace or a gas furnace may use a continuous furnace or a batch furnace.

The sintering temperature in the sintering method is not particularly limited. It is desirable that the sintering temperature should be the temperature that allows each compound to react and crystals to sufficiently grow. In terms of limiting the grain diameters in the range of 500 nm to 10 $\mu$m, the sintering temperature is preferably 1100° C. or more and 1300° C. or less, and more preferably 1100° C. or more and 1250° C. or less. The piezoelectric material sintered in the above temperature range demonstrates excellent piezoelectric performance. To stably reproduce the properties of the piezoelectric material obtained by the sintering process, the sintering process may be performed for 2 hours or more and 48 hours or less with the sintering temperature held constant in the above range. Further, a sintering method such as two-stage sintering may also be used. In view of productivity, however, it is desirable to use a method that does not involve a rapid temperature change.

It is desirable to polish the piezoelectric material obtained by the sintering process and then heat-treat the piezoelectric material at a temperature of 1000° C. or above. If the piezoelectric material is mechanically polished, a residual stress occurs within the piezoelectric material. The residual stress, however, is alleviated by heat-treating the piezoelectric material at 1000° C. or above. This makes the piezoelectric properties of the piezoelectric material more excellent. Further, the heat treatment also has the effect of removing the raw material powder of barium carbonate precipitated in grain boundary portions, or the like. The time of the heat treatment is not particularly limited, but is preferably an hour or more.

(Piezoelectric Element)

FIG. 1 is a schematic diagram illustrating the configuration of a piezoelectric element according to an exemplary embodiment of the present invention. The piezoelectric element according to the present invention is a piezoelectric element including at least a first electrode 1, a piezoelectric material portion 2, and a second electrode 3. The piezoelectric material portion 2 is the piezoelectric material according to the present invention.

The piezoelectric properties of the piezoelectric material according to the present invention can be evaluated by applying the piezoelectric material to a piezoelectric element including at least a first electrode and a second electrode. Each of the first and second electrodes is formed of a conductive layer having a thickness of about 5 nm to 10 μm. The material of the electrode is not particularly limited, and may be a material normally used for a piezoelectric element. Examples of the material include metals such as Ti, Pt, Ta, Ir, Sr, In, Sn, Au, Al, Fe, Cr, Ni, Pd, Ag, and Cu, alloys of these, and compounds of these.

Each of the first and second electrodes may contain one of these, or may be formed by stacking two or more of these. Further, the first and second electrodes may be different in material from each other.

The method for manufacturing the first and second electrodes is not limited. Each electrode may be formed by baking of a metal paste, or may be formed by sputtering or vapor deposition. Further, both the first and second electrodes may be patterned into desired shapes for use.

(Polarization Treatment)

It is more desirable that the spontaneous polarization axes of the piezoelectric element should be aligned in a certain direction. If the spontaneous polarization axes are aligned in a certain direction, the piezoelectric constant of the piezoelectric element becomes large.

The method for polarizing the piezoelectric element is not particularly limited. The polarization treatment may be performed in the atmosphere or in silicone oil. The temperature for the polarization is preferably a temperature at which the piezoelectric material becomes tetragonal. For example, the temperature for the polarization is preferably 60° C. to 150° C., but the optimal conditions are somewhat different depending on the composition of the piezoelectric material forming the element. An electric field to be applied to perform the polarization treatment is preferably 8 kV/cm to 20 kV/cm. In addition, it is desirable to end the application of the electric field after decreasing an ambient temperature to a temperature at which the piezoelectric material becomes orthorhombic, for obtaining an excellent piezoelectric constant.

(Measurements of Piezoelectric Constant and Mechanical Quality Factor)

To measure the piezoelectric constant and the mechanical quality factor of the piezoelectric element, first, the results of measuring the resonant frequency and the antiresonant frequency using a commercial impedance analyzer (4194A, manufactured by Agilent Technologies, Inc.) are obtained. Then, using the measurement results, the piezoelectric constant and the mechanical quality factor can be obtained through calculation based on Japan Electronics and Information Technology Industries Association (JEITA) standard (EM-4501). Hereinafter, this method is referred to as a "resonance-antiresonance method".

(Measurements of Phase Transition Temperature $T_{to}$ and Curie Temperature $T_c$)

The phase transition temperature $T_{to}$ and the Curie temperature $T_c$ can be obtained by measuring the capacitance of a sample using an impedance analyzer (4194A, manufactured by Agilent Technologies, Inc.) while changing the temperature of the sample. Simultaneously, the temperature dependence of the dielectric loss tangent can also be measured and obtained using the impedance analyzer. The phase transition temperature $T_{to}$ is a temperature at which the crystal system changes from tetragonal to orthorhombic. To measure the phase transition temperature $T_{to}$, the temperature of the sample is once lowered from room temperature to −100° C. and then raised to 150° C., and the dielectric constant is measured while cooling the sample. Then, the temperature at which a value obtained by differentiating the measured dielectric constant by the temperature of the sample is maximum is measured. The measured temperature is defined as the phase transition temperature $T_{to}$.

On the other hand, the Curie temperature $T_c$ is a temperature at which the dielectric constant is a local maximum near the phase transition temperature between a ferroelectric phase (a tetragonal phase) and a paraelectric phase (a cubic phase). The dielectric constant is measured while heating the sample, and a temperature at which the value of the measured dielectric constant is a local maximum is measured. The measured temperature is defined as the Curie temperature $T_c$.

(Multilayered Piezoelectric Element)

Next, a multilayered piezoelectric element according to the present invention will be described.

The multilayered piezoelectric element according to the present invention is a multilayered piezoelectric element in which a plurality of piezoelectric material layers and a plurality of electrode layers including an internal electrode are alternately stacked. A piezoelectric material forming the piezoelectric material layers is formed of the piezoelectric material according to the present invention.

Figure 2A:
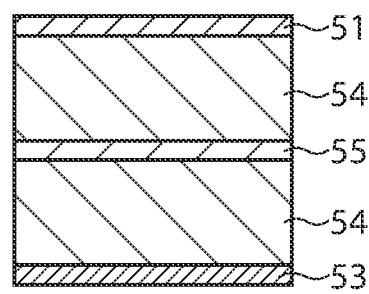
FIGS. 2A and 2B are schematic cross-sectional views each illustrating a configuration of a multilayered piezoelectric element according to an exemplary embodiment of the present invention.
Figure 2B:
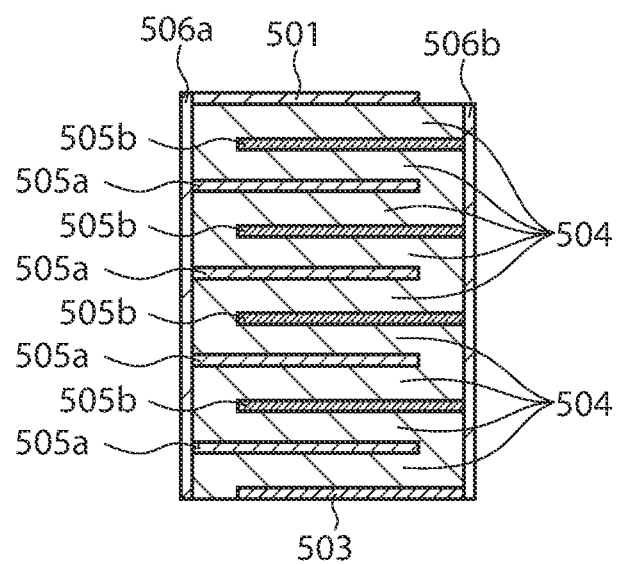

FIGS. 2A and 2B are schematic cross-sectional views each illustrating the configuration of the multilayered piezoelectric element according to an exemplary embodiment of the present invention. The multilayered piezoelectric element according to the present invention includes piezoelectric material layers 54 and electrode layers including an internal electrode 55, and is a multilayered piezoelectric element in which the piezoelectric material layers 54 and the electrode layers are alternately stacked. The piezoelectric material layers 54 are each formed of the above piezoelectric material. The electrode layers may include external electrodes such as a first electrode 51 and a second electrode 53 in addition to the internal electrode 55.

FIG. 2A illustrates the configuration of the multilayered piezoelectric element according to the present invention, in which two piezoelectric material layers 54 and the single internal electrode 55 are alternately stacked, and this multilayered structure is sandwiched between the first electrode 51 and the second electrode 53. As illustrated in FIG. 2B, the numbers of piezoelectric material layers and internal electrodes may be increased, and there is no limit on the number of layers. In the multilayered piezoelectric element in FIG. 2B, nine piezoelectric material layers 504 and eight internal electrodes 505 (505a or 505b) are alternately stacked. This multilayered structure is formed by sandwiching the piezoelectric material layers 504 between a first electrode 501 and a second electrode 503, and includes an external electrode 506a and an external electrode 506b for short-circuiting the alternately formed internal electrodes.

The sizes and the shapes of the internal electrodes 55 and 505 and the external electrodes 506a and 506b may not necessarily need to be the same as those of the piezoelectric material layers 54 and 504. Further, each of the internal electrodes 55 and 505 and the external electrodes 506a and 506b may be divided into a plurality of parts.

Each of the internal electrodes 55 and 505, the external electrodes 506a and 506b, the first electrodes 51 and 501, and the second electrodes 53 and 503 is formed of a conductive layer having a thickness of about 5 nm to 10 μm. The material of the electrode is not particularly limited, and may be a material normally used for a piezoelectric element. Examples of the material include metals such as Ti, Pt, Ta, Ir, Sr, In, Sn, Au, Al, Fe, Cr, Ni, Pd, Ag, and Cu, and compounds of these. Each of the internal electrodes 55 and 505 and the external electrodes 506a and 506b may be formed of one of these or a mixture or an alloy of two or more of these, or may be formed by stacking two or more of these. Further, the plurality of electrodes may be different in material from each other.

Each of the internal electrodes 55 and 505 contains Ag and Pd, and the weight ratio of M1/M2 is preferably $0.25 \leq M1/M2 \leq 4.0$, and more preferably $2.3 \leq M1/M2 \leq 4.0$ where the weight of the contained Ag is M1 and the weight of the contained Pd is M2. If the weight ratio of M1/M2 is less than 0.25, the sintering temperature of the internal electrode is high, which is not desirable. If, on the other hand, the weight ratio of M1/M2 is greater than 4.0, the internal electrode is formed in an insular manner, and therefore is not uniform in the surface, which is not desirable.

In terms of the low cost of the electrode material, it is desirable that each of the internal electrodes 55 and 505 should contain at least one of Ni and Cu. If at least one of Ni and Cu is used for each of the internal electrodes 55 and 505, it is desirable to sinter the multilayered piezoelectric element according to the present invention in a reducing atmosphere.

As illustrated in FIG. 2B, the plurality of electrodes including the internal electrodes 505 may be short-circuited to each other so that the driving voltage is in phase. For example, the internal electrodes 505a and the first electrode 501 may be short-circuited to each other by the external electrode 506a. The internal electrodes 505b and the second electrode 503 may be short-circuited to each other by the external electrode 506b. The internal electrodes 505a and the internal electrodes 505b may be alternately arranged. Further, the form of short-circuiting electrodes is not limited. An electrode or wiring for short circuit may be provided on the side surface of the multilayered piezoelectric element. Alternatively, a through-hole may be provided through the piezoelectric material layers 504, and a conductive material may be provided inside the through-hole, thereby short-circuiting electrodes to each other.

(Liquid Discharge Head)

Next, a liquid discharge head according to the present invention will be described.

The liquid discharge head according to the present invention includes at least a liquid chamber including a vibrating unit provided with the piezoelectric element or the multilayered piezoelectric element, and a discharge port communicating with the liquid chamber.

Figure 3A:
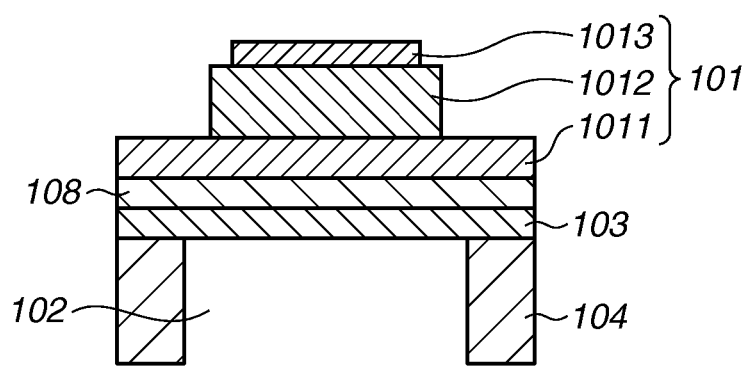
FIGS. 3A and 3B are schematic diagrams illustrating a configuration of a liquid discharge head according to an exemplary embodiment of the present invention.
Figure 3B:
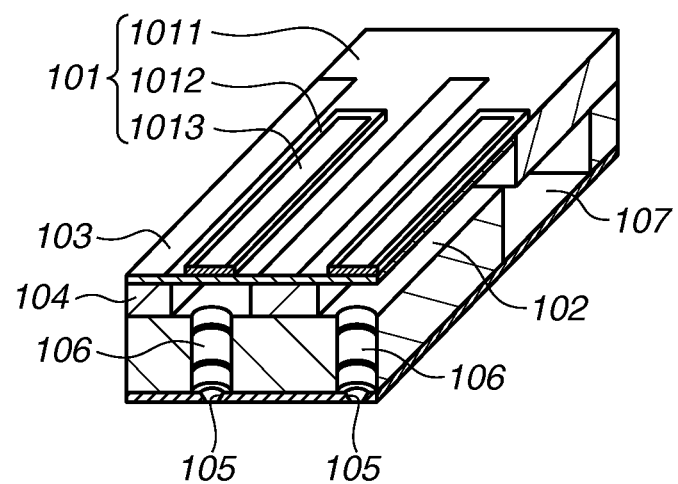

FIGS. 3A and 3B are schematic diagrams illustrating the configuration of the liquid discharge head according to an exemplary embodiment of the present invention. As illustrated in FIGS. 3A and 3B, the liquid discharge head according to the present invention is a liquid discharge head including a piezoelectric element 101 according to the present invention. The piezoelectric element 101 is a piezoelectric element including at least a first electrode 1011, a piezoelectric material 1012, and a second electrode 1013. The piezoelectric material 1012 is patterned where necessary, as illustrated in FIG. 3B.

FIG. 3B is a schematic diagram illustrating the liquid discharge head. The liquid discharge head includes a discharge port 105, an individual liquid chamber 102, a communication hole 106, which connects the individual liquid chamber 102 and the discharge port 105, a liquid chamber partition wall 104, a common liquid chamber 107, a diaphragm 103, and the piezoelectric element 101. In FIG. 3B, the piezoelectric element 101 is rectangular. Alternatively, the shape of the piezoelectric element 101 may be other than a rectangle, such as an ellipse, a circle, or a parallelogram. Generally, the piezoelectric material 1012 is shaped along the shape of the individual liquid chamber 102.

FIG. 3A illustrates the details of the vicinity of the piezoelectric element 101, which is included in the liquid discharge head according to the present invention. FIG. 3A is a cross-sectional view, in the width direction, of the piezoelectric element 101 illustrated in FIG. 3B. The cross-sectional shape of the piezoelectric element 101 is represented as a rectangle, but may be a trapezoid or an inverted trapezoid.

In FIG. 3A, the first electrode 1011 is used as a lower electrode, and the second electrode 1013 is used as an upper electrode. However, the arrangement of the first electrode 1011 and the second electrode 1013 is not limited to this. For example, the first electrode 1011 may be used as a lower electrode, or may be used as an upper electrode. Similarly, the second electrode 1013 may be used as an upper electrode, or may be used as a lower electrode. Further, a buffer layer 108 may be present between the diaphragm 103 and the lower electrode. The names of these components differ depending on the method for manufacturing the device, and the effects of the present invention can be obtained in any case.

In the liquid discharge head, the diaphragm 103 moves up and down by the expansion and contraction of the piezoelectric material 1012, thereby applying pressure to liquid in the individual liquid chamber 102. As a result, the liquid is discharged from the discharge port 105. The liquid discharge head according to the present invention can be used for a printer or used for the manufacturing of an electronic device.

The thickness of the diaphragm 103 is 1.0 μm or more and 15 μm or less, and preferably 1.5 μm or more and 8 μm or less. The material of the diaphragm 103 is not limited, but is preferably Si. Boron or phosphorus may be doped into the Si of the diaphragm 103. Further, the buffer layer 108 or the electrode on the diaphragm 103 may constitute a part of the diaphragm 103. The thickness of the buffer layer 108 is 5 nm or more and 300 nm or less, and preferably 10 nm or more and 200 nm or less. The size of the discharge port 105 is an equivalent circular diameter of 5 µm or more and 40 µm or less. The shape of the discharge port 105 may be a circle, a star shape, a square, or a triangle.

(Liquid Discharge Apparatus)

Next, a liquid discharge apparatus according to the present invention will be described. The liquid discharge apparatus according to the present invention includes a stage for an object and the liquid discharge head.

Figure 4:
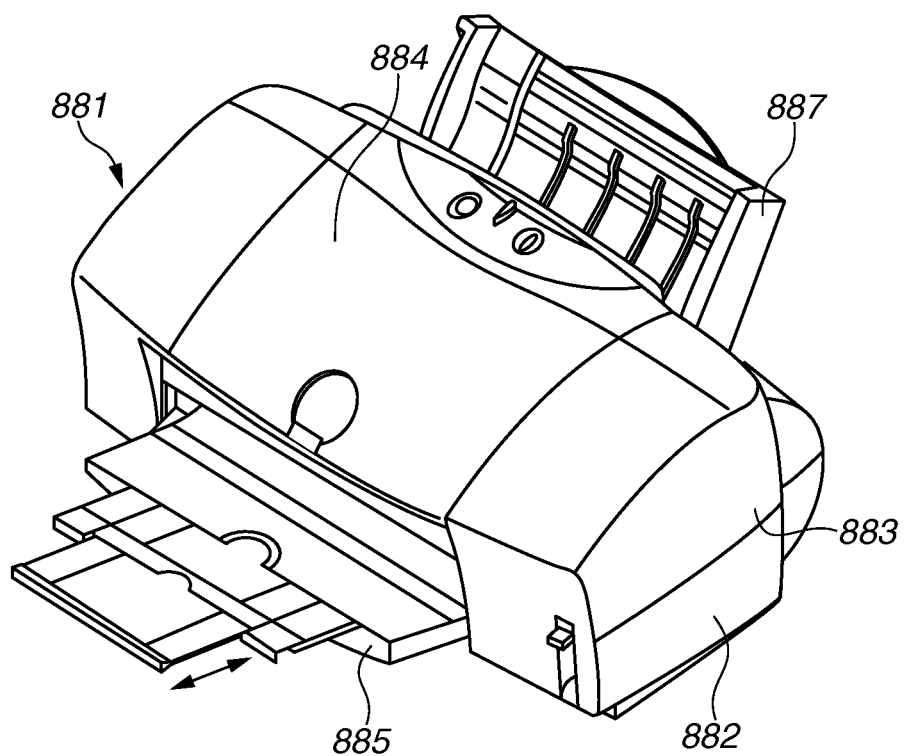
FIG. 4 is a schematic diagram illustrating a liquid discharge apparatus according to an exemplary embodiment of the present invention.
Figure 5:
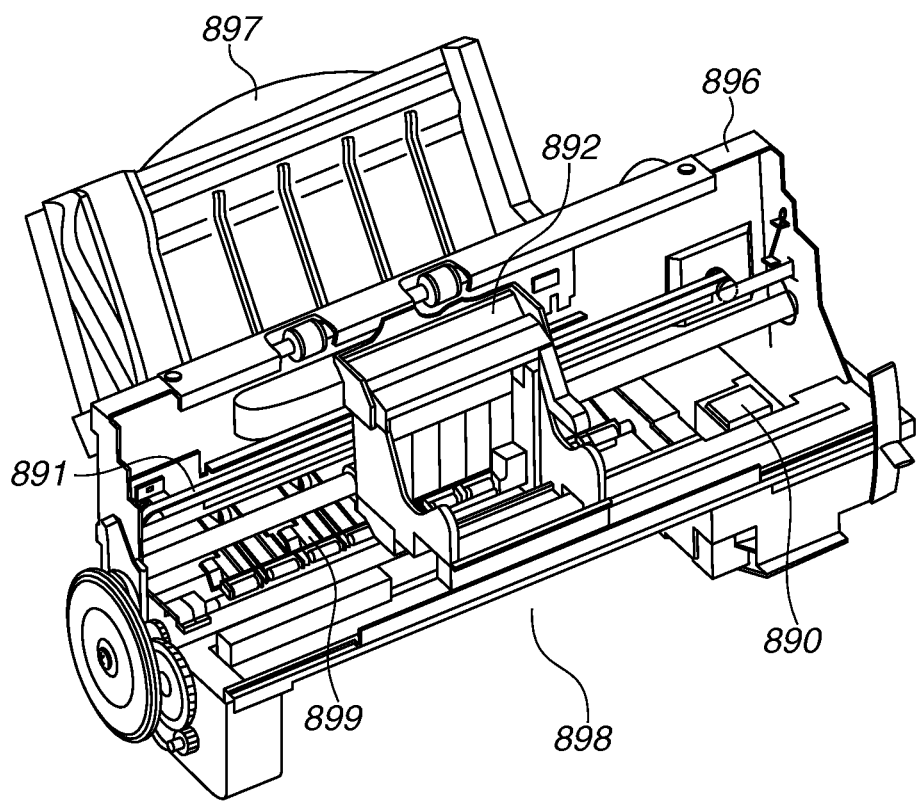
FIG. 5 is a schematic diagram illustrating the liquid discharge apparatus according to the exemplary embodiment of the present invention.

As an example of the liquid discharge apparatus according to the present invention, an inkjet recording apparatus illustrated in FIGS. 4 and 5 is given. FIG. 5 illustrates a state where components 885 and 887 are removed from exteriors 882, 883, 884 of a liquid discharge apparatus (an inkjet recording apparatus) 881 illustrated in FIG. 4. The inkjet recording apparatus 881 includes an automatic feeding unit 897, which automatically feeds a recording sheet as an object into an apparatus main body 896. Further, the inkjet recording apparatus 881 includes three units for guiding to a predetermined recording position the recording sheet fed from the automatic feeding unit 897, and guiding the recording sheet from the recording position to a discharge port 898. That is, the three units are a conveyance unit 899, which is a stage for an object, a recording unit 891, which performs recording onto the recording sheet conveyed to the recording position, and a recovery unit 890, which performs a recovery process on the recording unit 891. The recording unit 891 includes a carriage 892, which accommodates the liquid discharge head according to the present invention and is transported back and forth on a rail.

In such an inkjet recording apparatus, if the carriage 892 is transported on the rail according to an electric signal sent from a computer and a driving voltage is applied to electrodes sandwiching a piezoelectric material, the piezoelectric material is displaced. The displacement of the piezoelectric material applies a pressure onto the individual liquid chamber 102 through the diaphragm 103 illustrated in FIG. 3B, and ink is discharged from the discharge ports 105, thereby performing printing.

The liquid discharge apparatus according to the present invention can uniformly discharge liquid at high speed and can be downsized.

In the above example, a printer has been exemplified. Alternatively, the liquid discharge apparatus according to the present invention can be used for a printing apparatus such as an inkjet recording apparatus of a facsimile, a multifunction peripheral, or a copying machine, an industrial liquid discharge apparatus, or a drawing apparatus for drawing on a target object.

Additionally, a user can select a desired object according to use. The configuration may be such that the liquid discharge head moves relative to an object placed on the stage.

(Ultrasonic Motor)

Next, an ultrasonic motor according to the present invention will be described. The ultrasonic motor according to the present invention includes at least a vibrating member provided with the piezoelectric element or the multilayered piezoelectric element, and a moving member in contact with the vibrating member.

Figure 6A:
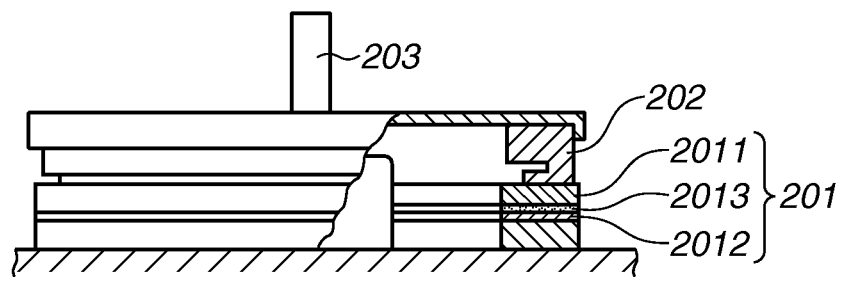
FIGS. 6A and 6B are schematic diagrams illustrating a configuration of an ultrasonic motor according to an exemplary embodiment of the present invention.
Figure 6B:
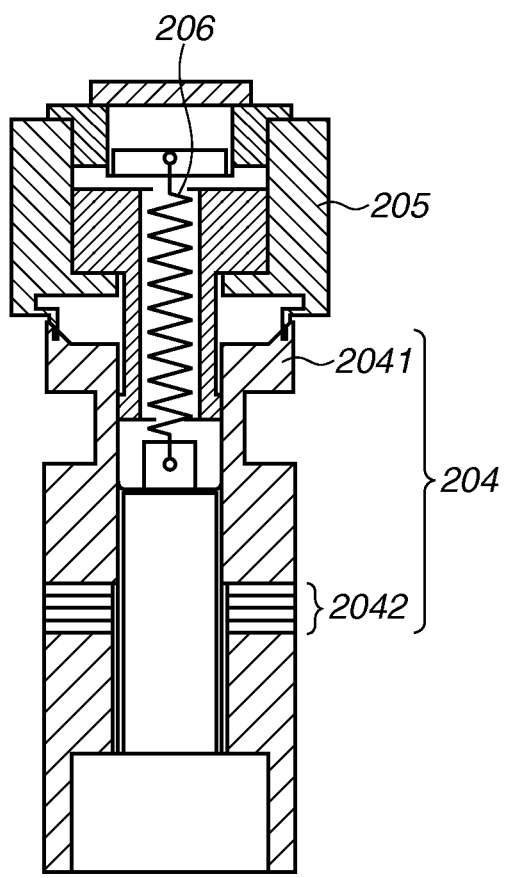

FIGS. 6A and 6B are schematic diagrams illustrating the configuration of the ultrasonic motor according to the present invention. FIG. 6A illustrates an ultrasonic motor including the piezoelectric element according to the present invention that is composed of a single plate. The ultrasonic motor includes an oscillator 201, a rotor 202, which is in contact with a sliding surface of the oscillator 201 by the pressing force of a pressing spring (not illustrated), and an output shaft 203, which is integrally formed with the rotor 202. The oscillator 201 includes a metallic elastic ring 2011, a piezoelectric element 2012 according to the present invention, and an organic adhesive 2013 (an epoxy adhesive or a cyanoacrylate adhesive), which adheres the piezoelectric element 2012 to the elastic ring 2011. The piezoelectric element 2012 according to the present invention includes a piezoelectric material sandwiched between a first electrode (not illustrated) and a second electrode (not illustrated).

If two alternating voltages having phases different by an odd multiple of $\pi/2$ are applied to the piezoelectric element 2012 according to the present invention, a flexural traveling wave occurs in the oscillator 201, and each point on the sliding surface of the oscillator 201 makes an elliptical motion. If the rotor 202 is in pressure contact with the sliding surface of the oscillator 201, the rotor 202 is subjected to the frictional force of the oscillator 201 and rotates in a direction opposite to that of the flexural traveling wave. A driven member (not illustrated) is joined with the output shaft 203 and driven by the rotational force of the rotor 202. If a voltage is applied to the piezoelectric material, the piezoelectric material expands and contracts by the transverse piezoelectric effect. If an elastic member made of a metal is joined with the piezoelectric element 2012, the elastic member is bent by the expansion and contraction of the piezoelectric material. The type of ultrasonic motor described here uses this principle.

Next, FIG. 6B exemplifies an ultrasonic motor including a piezoelectric element having a multilayered structure. An oscillator 204 includes a multilayered piezoelectric element 2042, which is sandwiched between cylindrical metallic elastic members 2041. The multilayered piezoelectric element 2042 is an element including a plurality of stacked piezoelectric materials (not illustrated), and includes a first electrode and a second electrode on the outer surfaces of the stacked layers and internal electrodes between the inner surfaces of the stacked layers. The metallic elastic members 2041 are fastened to each other with bolts to fix the piezoelectric element 2042 in a sandwich manner, thereby forming the oscillator 204.

Alternating voltages having different phases are applied to the multilayered piezoelectric element 2042, thereby causing the oscillator 204 to excite two oscillations orthogonal to each other. These two oscillations are combined together to form a circular oscillation for driving a leading edge portion of the oscillator 204. In an upper portion of the oscillator 204, an annular groove is formed in a constricted manner to increase the displacement of the oscillation for the driving. A rotor 205 is in pressure contact with the oscillator 204 by a pressurizing spring 206, thereby obtaining a frictional force for the driving. The rotor 205 is rotatably supported by a bearing.

(Optical Device)

Next, an optical device according to the present invention will be described. The optical device according to the present invention includes a driving unit provided with ultrasonic motor.

Figure 7A:
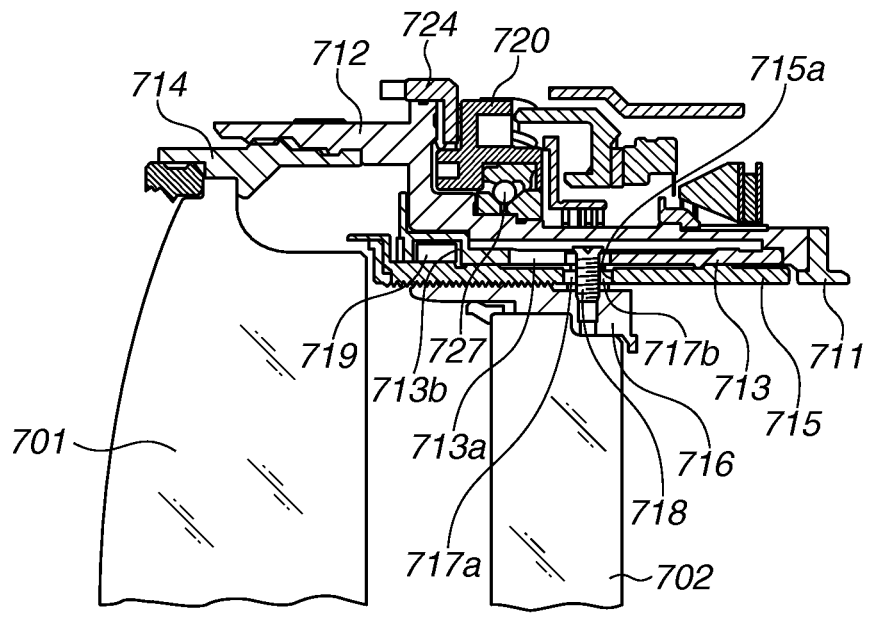
FIGS. 7A and 7B are schematic diagrams illustrating an optical device according to an exemplary embodiment of the present invention.
Figure 7B:
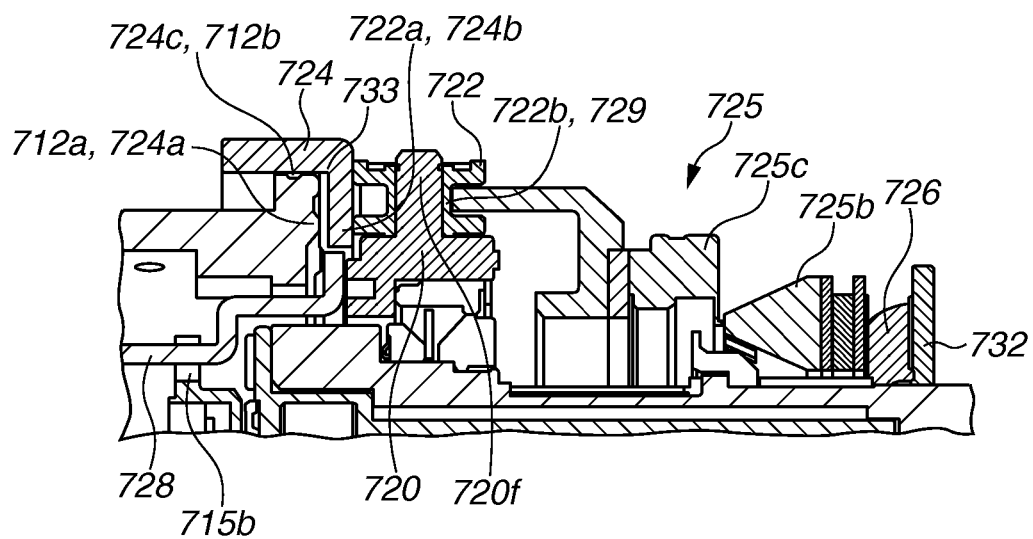
Figure 8:
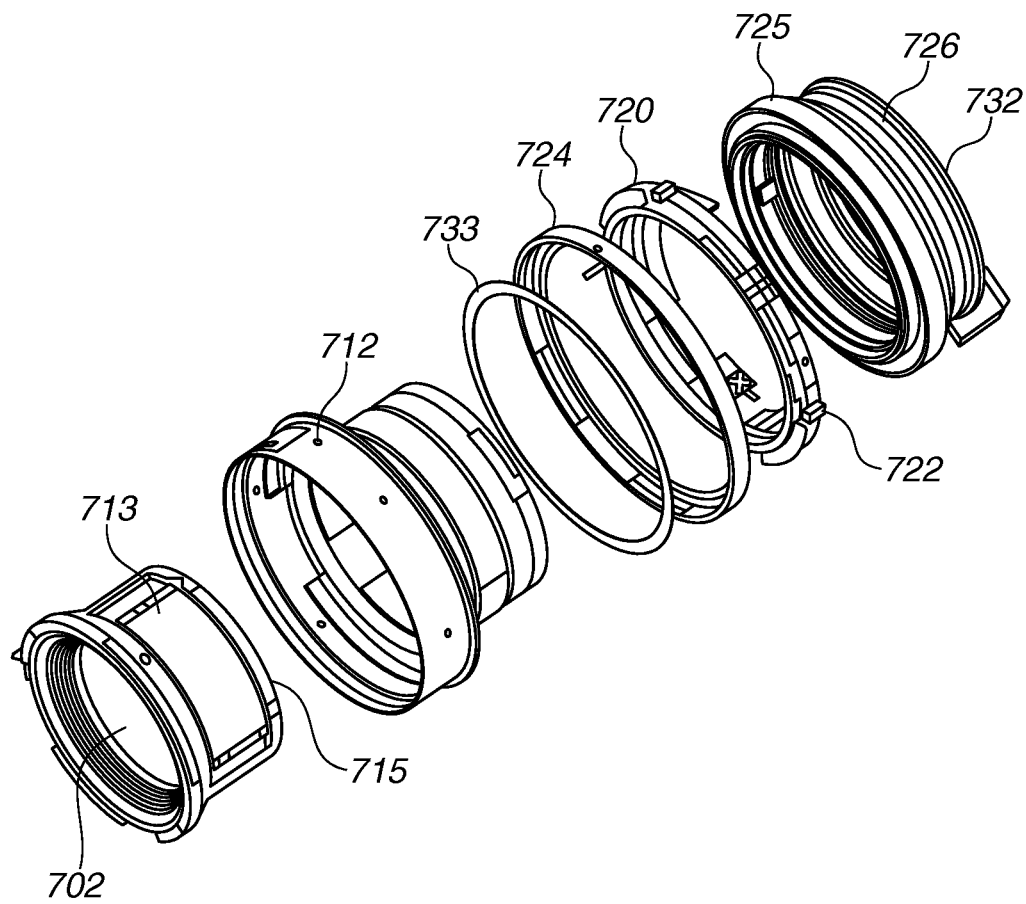
FIG. 8 is a schematic diagram illustrating an optical device according to an exemplary embodiment of the present invention.

FIGS. 7A and 7B are main cross-sectional views of an interchangeable lens barrel of a single-lens reflex camera, which is an example of the optical device according to a suitable exemplary embodiment of the present invention. Further, FIG. 8 is an exploded perspective view of the interchangeable lens barrel of the single-lens reflex camera, which is an example of the optical device according to a suitable exemplary embodiment of the present invention. To a mount 711, which is detachably attached to the camera, a fixed barrel 712, an advancement guide barrel 713, and a front lens group barrel 714 for supporting a front lens group 701 are fixed. These components are fixed members of the interchangeable lens barrel.

In the advancement guide barrel 713, an advancement guide groove 713a is formed for guiding a focus lens 702 in the optical axis direction. To a rear lens group barrel 716, which holds the focus lens 702, cam rollers 717a and 717b, which protrude outward in the radial direction, are fixed with a shaft screw 718. The cam roller 717a fits into the advancement guide groove 713a.

A cam ring 715 turnably fits into the inner circumference of the advancement guide barrel 713. A roller 719, which is fixed to the cam ring 715, fits into an annular groove 713b of the advancement guide barrel 713, thereby regulating the relative movements of the advancement guide barrel 713 and the cam ring 715 in the optical axis direction. In the cam ring 715, a cam groove 715a is formed for the focus lens 702, and the cam roller 717b also fits into the cam groove 715a.

On the outer circumferential side of the fixed barrel 712, a rotation transmission ring 720 is placed. The rotation transmission ring 720 is rotatably held at a fixed position relative to the fixed barrel 712 by a ball race 727. In the rotation transmission ring 720, a driven roller 722 is rotatably held on a shaft 720f, which extends radially from the rotation transmission ring 720. A larger-diameter portion 722a of the driven roller 722 is in contact with a mount-side end surface 724b of a manual focus ring 724. Further, a smaller-diameter portion 722b of the driven roller 722 is in contact with a joint member 729. Actually, six driven rollers 722 are placed at regular intervals on the outer circumference of the rotation transmission ring 720 and are each formed based on the above relationship.

In an inner circumferential portion of the manual focus ring 724, a low friction sheet (washer member) 733 is placed and sandwiched between a mount-side end surface 712a of the fixed barrel 712 and a front-side end surface 724a of the manual focus ring 724. Further, the outer circumferential surface of the low friction sheet 733 is ring-shaped and circumferentially fits with an inner circumference 724c of the manual focus ring 724. Further, the inner circumference 724c of the manual focus ring 724 circumferentially fits with an outer circumferential portion 712b of the fixed barrel 712. The low friction sheet 733 functions to reduce friction in a rotation ring mechanism having the configuration in which the manual focus ring 724 rotates about the optical axis relative to the fixed barrel 712.

The larger-diameter portion 722a of the driven roller 722 and the mount-side end surface 724b of the manual focus ring 724 are in contact with each other in a state where a pressing force is applied to the larger-diameter portion 722a and the mount-side end surface 724b by the force of a wave washer 726 pressing an ultrasonic motor 725 in the forward direction of the lens 702. Further, similarly, the smaller-diameter portion 722b of the driven roller 722 and the joint member 729 are also in contact with each other in a state where a moderate pressing force is applied to the smaller-diameter portion 722b and the joint member 729 by the force of the wave washer 726 pressing the ultrasonic motor 725 in the forward direction of the lens 702. The movement of the wave washer 726 in the direction of the mount 711 is regulated by a washer 732, which is bayonet-coupled to the fixed barrel 712. The spring force (urging force) generated by the wave washer 726 is transmitted to the ultrasonic motor 725 and further to the driven roller 722 and also results in the force of the manual focus ring 724 pressing the mount-side end surface 712a of the fixed barrel 712. That is, the manual focus ring 724 is incorporated while being pressed against the mount-side end surface 712a of the fixed barrel 712 through the low friction sheet 733.

Thus, if the ultrasonic motor 725 is driven to rotate relative to the fixed barrel 712 by a control unit (not illustrated), the driven roller 722 rotates about the shaft 720f because the joint member 729 is in friction contact with the smaller-diameter portion 722b of the driven roller 722. If the driven roller 722 rotates about the shaft 720f, as a result, the rotation transmission ring 720 rotates about the optical axis (an autofocus operation).

Further, if a rotational force about the optical axis is applied to the manual focus ring 724 by a manual operation input unit (not illustrated), the manual focus ring 724 acts as follows. That is, since the mount-side end surface 724b of the manual focus ring 724 is in pressure contact with the larger-diameter portion 722a of the driven roller 722, the driven roller 722 rotates about the shaft 720f due to the frictional force. If the larger-diameter portion 722a of the driven roller 722 rotates about the shaft 720f, the rotation transmission ring 720 rotates about the optical axis. At this time, the friction holding power of a rotor 725c and a stator 725b prevents the ultrasonic motor 725 from rotating (a manual focus operation).

To the rotation transmission ring 720, two focus keys 728 are attached at positions opposed to each other, and each fit with a notch portion 715b, which is provided at the leading edge of the cam ring 715. Thus, if an autofocus operation or a manual focus operation is performed to rotate the rotation transmission ring 720 about the optical axis, the rotational force of the rotation transmission ring 720 is transmitted to the cam ring 715 through the focus keys 728. If the cam ring 715 is rotated about the optical axis, the rear lens group barrel 716, of which the rotation is regulated by the cam roller 717a and the advancement guide groove 713a, advances or retreats along the cam groove 715a of the cam ring 715 by the cam roller 717b. Consequently, the focus lens 702 is driven, and a focus operation is performed.

While an interchangeable lens barrel of a single-lens reflex camera has been described as an example of the optical device according to the present invention, the present invention is applicable to an optical device including a driving unit provided with an ultrasonic motor, such as a compact camera, an electronic still camera, or a camera-equipped personal digital assistant, regardless of the type of camera.

(Oscillatory Device and Dust Removing Device)

An oscillatory device for conveying or removing a particle, a powder, or a droplet is widely used for an electronic device.

As an example of an oscillatory device according to the present invention, a dust removing device using the piezoelectric element according to the present invention will be described below. The oscillatory device according to the present invention includes a vibrating member including a diaphragm provided with the above piezoelectric element or the above multilayered piezoelectric element. The dust removing device according to the present invention includes a vibrating unit provided with the oscillatory device.

Figure 9A:
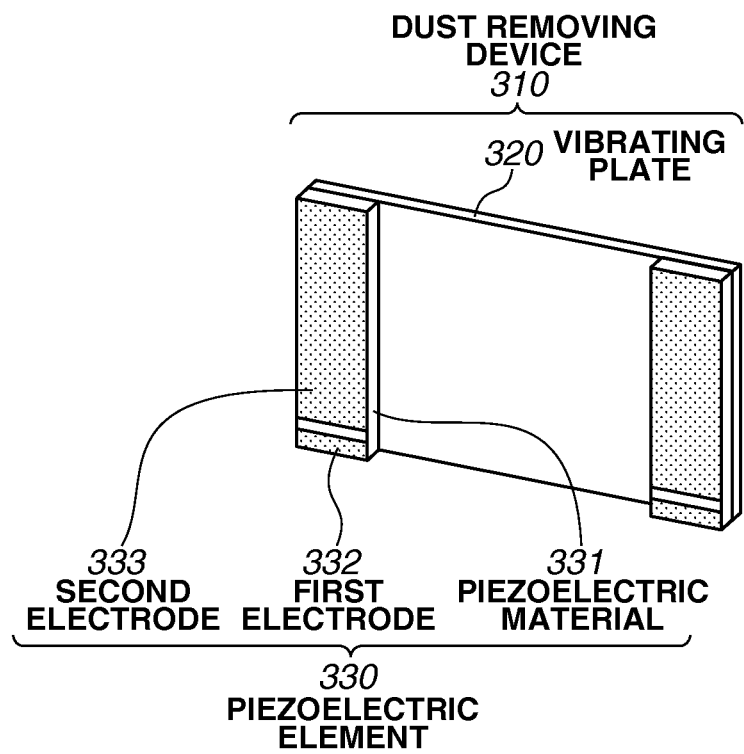
FIGS. 9A and 9B are schematic diagrams illustrating a case where an oscillatory device according to an exemplary embodiment of the present invention is used as a dust removing device.
Figure 9B:
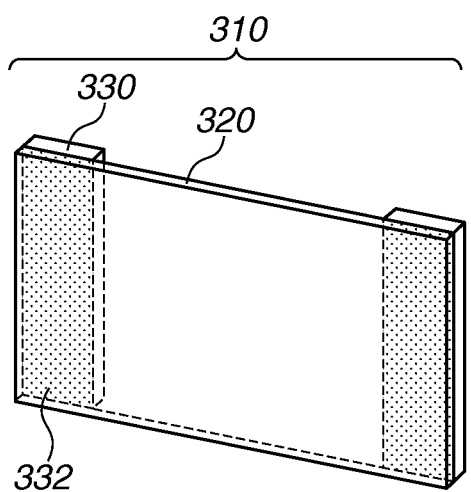

FIGS. 9A and 9B are schematic diagrams illustrating a dust removing device according to an exemplary embodiment of the present invention. A dust removing device 310 includes a plate-shaped piezoelectric element 330 and a diaphragm 320. The piezoelectric element 330 may be the multilayered piezoelectric element according to the present invention. The material of the diaphragm 320 is not limited.

When, however, the dust removing device 310 is used for an optical device, a translucent material or a light-reflective material can be used for the diaphragm 320.

Figures 10A, 10B, 10C:
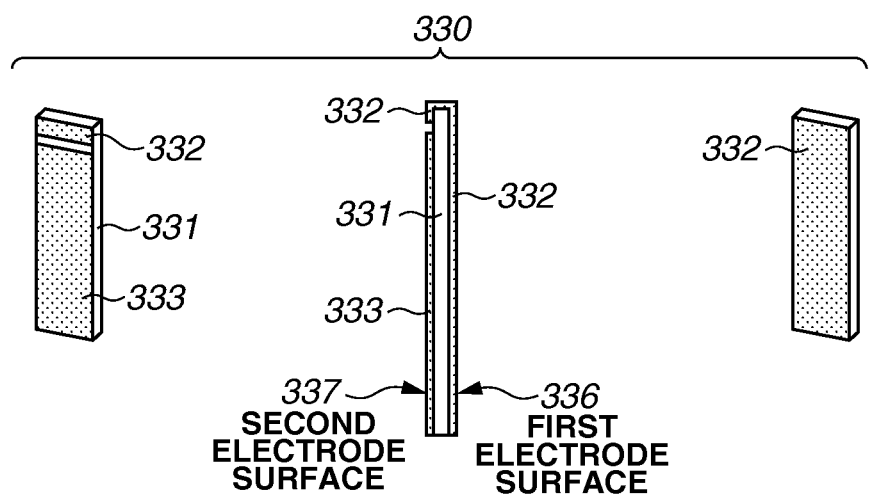
FIGS. 10A to 10C are schematic diagrams illustrating a configuration of a piezoelectric element in a dust removing device according to an exemplary embodiment of the present invention.

FIGS. 10A to 10C are schematic diagrams illustrating the configuration of the piezoelectric element 330 in FIGS. 9A and 9B. FIGS. 10A and 10C illustrate the configurations of the front and back surfaces of the piezoelectric element 330. FIG. 10B illustrates the configuration of the side surface of the piezoelectric element 330. As illustrated in FIGS. 9A and 9B, the piezoelectric element 330 includes a piezoelectric material 331, a first electrode 332, and a second electrode 333. The first electrode 332 and the second electrode 333 are placed to be opposed to each other on the plate surfaces of the piezoelectric material 331. Similarly to FIGS. 9A and 9B, the piezoelectric element 330 may be the multilayered piezoelectric element according to the present invention. In this case, the piezoelectric material 331 has an alternate structure including piezoelectric material layers and internal electrodes, and the internal electrodes are alternately short-circuited to the first electrode 332 or the second electrode 333. Thus, it is possible to provide driving waveforms different in phase to the piezoelectric material layers. In FIG. 10C, the surface of the piezoelectric element 330 which appears on the front side and on which the first electrode 332 is provided is defined as a first electrode surface 336. In FIG. 10A, the surface of the piezoelectric element 330 which appears on the front side and on which the second electrode 333 is provided is defined as a second electrode surface 337.

In the present invention, an "electrode surface" refers to the surface of a piezoelectric element on which an electrode is provided. For example, as illustrated in FIG. 10B, the first electrode 332 may extend around the piezoelectric material 331 to the second electrode surface 337.

As illustrated in FIGS. 9A and 9B, the piezoelectric element 330 and the diaphragm 320 are fixedly attached to the plate surface of the diaphragm 320 on the first electrode surface 336 of the piezoelectric element 330. Then, the driving of the piezoelectric element 330 causes a stress between the piezoelectric element 330 and the diaphragm 320, thereby causing the diaphragm 320 to generate an out-of-plane oscillation. The dust removing device 310 according to the present invention is an apparatus for removing, by the out-of-plane oscillation of the diaphragm 320, foreign matter such as dust attached to the surface of the diaphragm 320. The "out-of-plane oscillation" means an elastic oscillation that displaces the diaphragm 320 in the optical axis direction, that is, the thickness direction of the diaphragm 320.

FIGS. 11A and 11B are schematic diagrams illustrating the oscillation principle of the dust removing device 310 according to the present invention. FIG. 11A represents a state where in-phase alternating voltages are applied to a pair of left and right piezoelectric elements 330 to cause the diaphragm 320 to generate an out-of-plane oscillation. The polarization direction of the piezoelectric material forming the pair of left and right piezoelectric elements 330 is the same as the thickness direction of each piezoelectric element 330. The dust removing device 310 is driven in the seventh oscillation mode. FIG. 11B represents a state where anti-phase alternating voltages, which differ in phase by 180°, are respectively applied to the pair of left and right piezoelectric elements 330 to cause the diaphragm 320 to generate an out-of-plane oscillation. The dust removing device 310 is driven in the sixth oscillation mode. The dust removing device 310 according to the present invention is an apparatus capable of effectively removing dust attached to the surface of a diaphragm, by appropriately using either of at least two oscillation modes.

(Imaging Apparatus)

Figure 12:
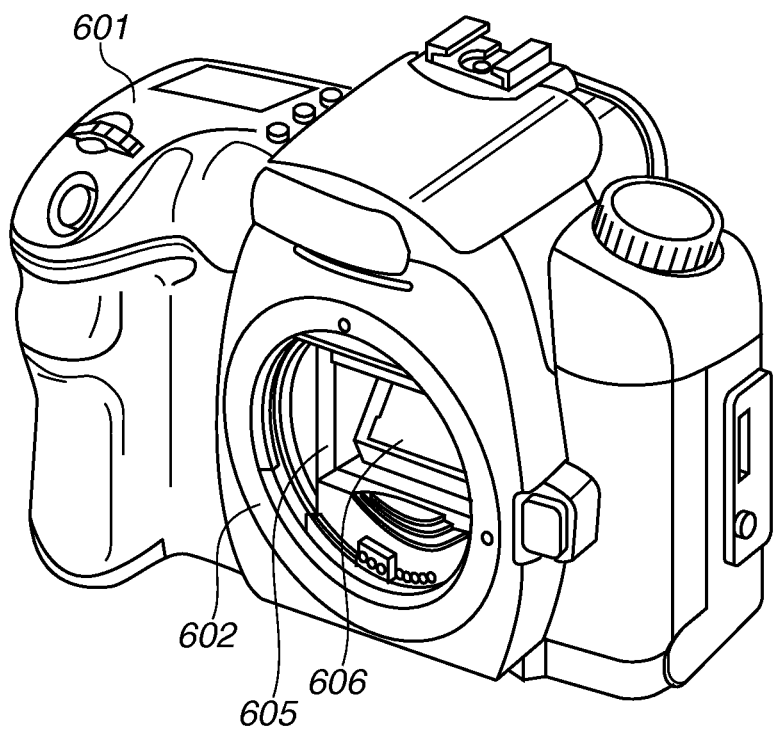
FIG. 12 is a schematic diagram illustrating an imaging apparatus according to an exemplary embodiment of the present invention.
Figure 13:
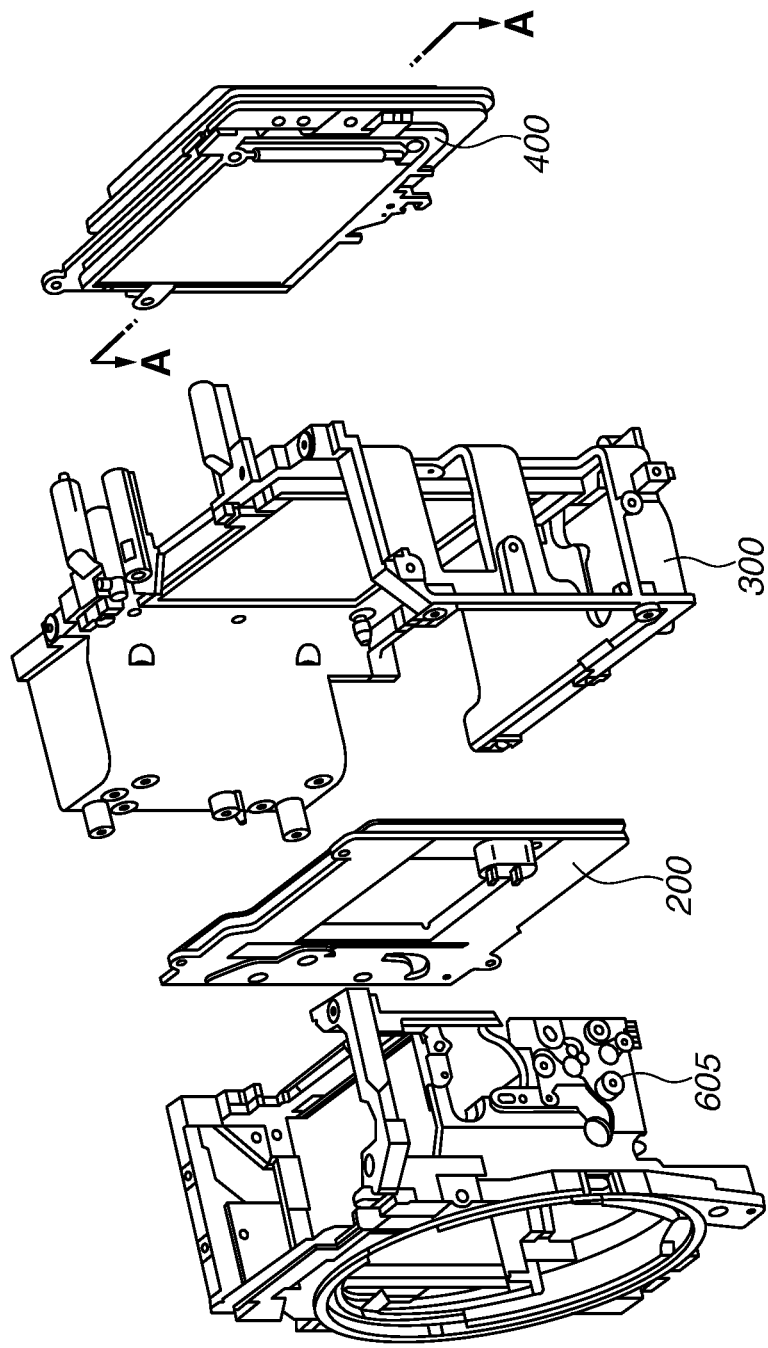
FIG. 13 is a schematic diagram illustrating an imaging apparatus according to an exemplary embodiment of the present invention.

Next, an imaging apparatus according to the present invention will be described. The imaging apparatus according to the present invention is an imaging apparatus including at least the dust removing device and an image sensor unit. The diaphragm of the dust removing device is provided on the light-receiving surface side of the image sensor unit. FIGS. 12 and 13 are diagrams illustrating a digital single-lens reflex camera, which is an example of the imaging apparatus according to a suitable exemplary embodiment of the present invention.

FIG. 12 is a front perspective view of a camera main body 601 as viewed from an object side, and illustrates a state where an imaging lens unit is removed. FIG. 13 is an exploded perspective view of the general configuration of the inside of the camera for illustrating the peripheral structure of the dust removing device according to the present invention and an imaging unit 400.

In the camera main body 601, a mirror box 605 is provided, to which an imaging light flux having passed through an imaging lens is guided. In the mirror box 605, a main mirror (quick-return mirror) 606 is disposed. The main mirror 606 can enter a state of being held at an angle of 45° with respect to an imaging optical axis to guide the imaging light flux in the direction of a pentagonal roof mirror (not illustrated), or a state of being held at a position where the main mirror 606 is retracted from the imaging light flux to guide the imaging light flux in the direction of an image sensor (not illustrated).

On the object side of a main body chassis 300, which is the framework of the camera main body 601, the mirror box 605 and a shutter unit 200 are disposed in this order from the object side. Further, on the photographer side of the main body chassis 300, the imaging unit 400 is disposed. The imaging unit 400 is provided by being adjusted so that the imaging surface of the image sensor is placed at a predetermined distance from and parallel to the attachment surface of a mount unit 602, which serves as a reference for the attachment of the imaging lens unit.

The imaging unit 400 includes a vibrating member of the dust removing device and an image sensor unit. Further, the vibrating member of the dust removing device and the light-receiving surface of the image sensor unit are provided coaxially in order.

While a digital single-lens reflex camera has been described as an example of the imaging apparatus according to the present invention, an interchangeable imaging lens unit camera, such as a mirrorless digital single-lens camera, which does not include the mirror box 605, may be used. Further, the present invention is also applicable to particularly a device that requires the removal of dust attached to the surface of an optical component, among various imaging apparatuses or electronic and electrical devices including an imaging apparatus, such as an interchangeable imaging lens unit video camera, a copying machine, a facsimile, and a scanner.

(Electronic Device)

Next, an electronic device according to the present invention will be described. The electronic device according to the present invention includes a piezoelectric acoustic component provided with the piezoelectric element or the multi-layered piezoelectric element. Examples of the piezoelectric acoustic component include a loudspeaker, a buzzer, a microphone, and a surface acoustic wave (SAW) device.

Figure 14:
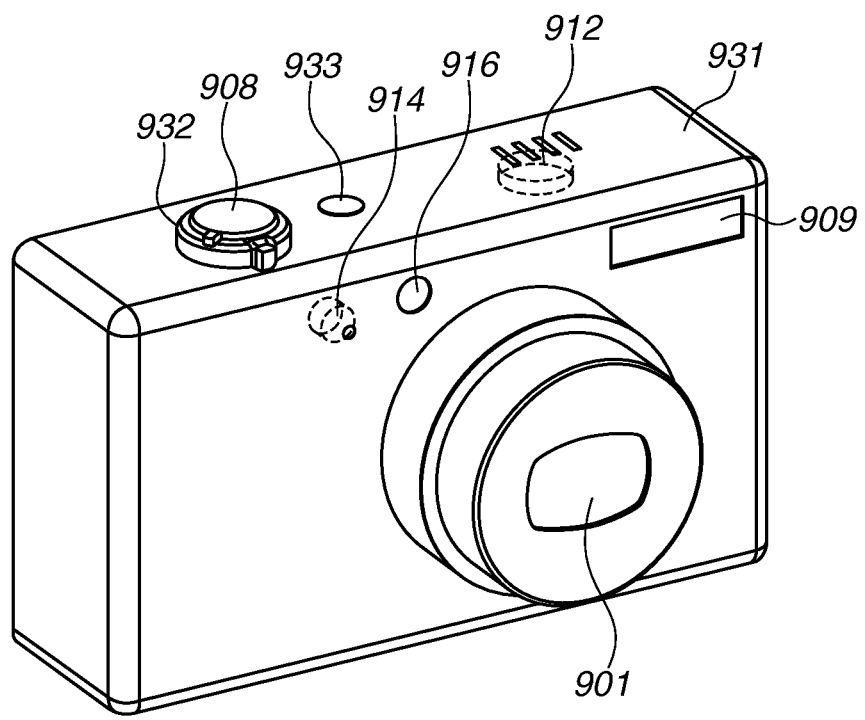
FIG. 14 is a schematic diagram illustrating an electronic device according to an exemplary embodiment of the present invention.

FIG. 14 is an overall perspective view of a digital camera, which is an example of the electronic device according to a suitable exemplary embodiment of the present invention, as viewed from the front of a main body 931 of the digital camera. On the front surface of the main body 931, an optical apparatus 901, a microphone 914, a flash light-emitting unit 909, and an auxiliary light unit 916 are placed. The microphone 914 is built into the main body 931, and therefore is indicated by a dashed line. In front of the microphone 914, a hole shape for picking up a sound from outside is provided.

On the upper surface of the main body 931, a power button 933, a loudspeaker 912, a zoom lever 932, and a shutter release button 908 for performing a focusing operation are placed. The loudspeaker 912 is built into the main body 931, and therefore is indicated by a dashed line. In front of the loudspeaker 912, a hole shape for transmitting a sound to the outside is provided.

The piezoelectric acoustic component according to the present invention is used for at least one of the microphone 914, the loudspeaker 912, and a surface acoustic wave device.

While a digital camera has been described as an example of the electronic device according to the present invention, the electronic device according to the present invention is also applicable to various electronic devices including a piezoelectric acoustic component, such as a sound reproduction device, a sound recording device, a mobile phone, and an information terminal.

As described above, the piezoelectric element and the multilayered piezoelectric element according to the present invention are suitably used for a liquid discharge head, a liquid discharge apparatus, an ultrasonic motor, an optical device, an oscillatory device, a dust removing device, an imaging apparatus, and an electronic device. The piezoelectric element and the multilayered piezoelectric element according to the present invention are suitably used particularly for driving at low temperature.

By using the piezoelectric element and the multilayered piezoelectric element according to the present invention, it is possible to provide a liquid discharge head having a nozzle density and a discharge velocity that are equivalent to or greater than that of when a piezoelectric element containing lead is used.

By using the liquid discharge head according to the present invention, it is possible to provide a liquid discharge apparatus having a discharge velocity and discharge accuracy that are equivalent to or greater than that of when a piezoelectric element containing lead is used.

By using the piezoelectric element and the multilayered piezoelectric element according to the present invention, it is possible to provide an ultrasonic motor having a driving force and durability that are equivalent to or greater than that of when a piezoelectric element containing lead is used.

By using the ultrasonic motor according to the present invention, it is possible to provide an optical device having durability and operation accuracy that are equivalent to or greater than that of when a piezoelectric element containing lead is used.

By using the piezoelectric element and the multilayered piezoelectric element according to the present invention, it is possible to provide an oscillatory device having vibration performance and durability that are equivalent to or greater than that of when a piezoelectric element containing lead is used.

By using the oscillatory device according to the present invention, it is possible to provide a dust removing device having dust removing efficiency and durability that are equivalent to or greater than that of when a piezoelectric element containing lead is used.

By using the dust removing device according to the present invention, it is possible to provide an imaging apparatus having a dust removing function that is equivalent to or better than that of when a piezoelectric element containing lead is used.

By using a piezoelectric acoustic component including the piezoelectric element or the multilayered piezoelectric element according to the present invention, it is possible to provide an electronic device having sound production properties that are equivalent to or better that of when a piezoelectric element containing lead is used.

The piezoelectric material according to the present invention can be used for devices such as an ultrasonic oscillator, a piezoelectric actuator, a piezoelectric sensor, and a ferroelectric memory, in addition to a liquid discharge head and a motor.

EXAMPLES

The present invention will be described more specifically below with examples. The present invention, however, is not limited to the following examples.

The piezoelectric material according to the present invention was produced by the following procedure.
(Piezoelectric Material)
(Piezoelectric Material of Example 1)

Raw materials corresponding to a composition $Ba_{1.0005}(Ti_{0.960}Zr_{0.040})O_3$, which is represented by the general formula (1) of $Ba_a(Ti_{1-x}Zr_x)O_3$, where x=0.040 and a=1.0005, were weighed in the following manner.

Raw material powders of barium titanate having an average particle diameter of 100 nm and a purity of 99.99% or more and barium zirconate having an average particle diameter of 300 nm and a purity of 99.99% or more were prepared by a solid phase method. On that basis, the raw material powders were weighed so that the proportions of Ba, Ti, and Zr resulted in the composition $Ba_{1.0005}(Ti_{0.960}Zr_{0.040})O_3$. Further, barium carbonate and titanium oxide were used to adjust "a" indicating the ratio of the molar amount of Ba at the A site to the molar amount of Ti and Zr at the B site.

Manganese dioxide was weighed so that the amount of an Mn element contained as the first auxiliary component was 0.015 moles relative to 1 mole of the composition $Ba_{1.0005}(Ti_{0.960}Zr_{0.040})O_3$. Bismuth oxide was weighed so that the amount of a Bi element contained as the second auxiliary component was 0.00200 moles relative to 1 mole of the metal oxide as the main component. Silicon dioxide was weighed so that, as one of the third auxiliary components, Si was 0.0670 parts by weight in terms of metal relative to 100 parts by weight of the metal oxide as the main component. Boron oxide was weighed so that, as one of the third auxiliary components, B was 0.0330 parts by weight in terms of metal relative to 100 parts by weight of the metal oxide as the main component.

These weighed powders were mixed together by dry blending for 24 hours, using a ball mill. Then, 3 parts by weight of a PVA binder was attached to the surface of the mixed powder using a spray dryer apparatus, thereby granulating the mixed powder.

Next, a metal mold was filled with the obtained granulated powder, and a molding pressure of 200 MPa was applied to the granulated powder using a press molding machine, thereby preparing a disk-shaped compact. The compact was further pressed using a cold isostatic pressing machine, but the obtained results were similar.

The obtained compact was placed in an electric furnace, held for 4 hours under the condition of a maximum sintering temperature $T_{max}$ of 1200° C., and sintered in the atmosphere for a total of 24 hours, thereby obtaining a ceramic including the piezoelectric material according to the present invention.

Then, the average equivalent circular diameter and the relative density of the crystal grains forming the obtained ceramic were evaluated. As a result, the average equivalent circular diameter was 3.2 μm, and the relative density was 98.9%. The crystal grains were observed mainly using a polarizing microscope. To specify the grain diameter of a small crystal grain, an SEM was used. Photographic images obtained by photographing the crystal grains using the polarizing microscope and the SEM were subjected to image processing, and the average equivalent circular diameter was calculated. Further, the relative density was evaluated using the Archimedes' principle.

Next, the obtained ceramic was polished so as to have a thickness of 0.5 mm, and the crystal structure of the ceramic was analyzed by X-ray diffraction. As a result, only peaks corresponding to a perovskite structure were observed.

Further, the composition of the obtained ceramic was evaluated by an ICP emission spectroscopic analysis. As a result, it was understood that the piezoelectric material included as the main component a metal oxide that can be represented by a chemical formula $Ba_{1.0005}(Ti_{0.960}Zr_{0.040})O_3$. Further, it was also understood that the Mn element was 0.015 moles and the Bi element was 0.00200 moles, relative to 1 mole of the metal oxide as the main component. Further, it was also understood that 0.0670 parts by weight of Si in terms of metal and 0.0330 parts by weight of B in terms of metal were contained relative to 100 parts by weight of the metal oxide as the main component. As a result, it was understood that the weighed composition coincided with the composition after sintering.

Further, the crystal grains were observed again, but the average equivalent circular diameter was not significantly different between before and after the polishing.

(Piezoelectric Materials of Examples 2 to 29)

Piezoelectric materials of Examples 2 to 29 were prepared by processes similar to those of Example 1. First, each raw material powder was weighed so that the proportions of Ba, Ti, and Zr were as illustrated in Table 1. Barium carbonate and titanium oxide were used to adjust "a" indicating the ratio of the molar amount of Ba at the A site to the molar amount of Ti and Zr at the B site. Next, the sum (the combined value) of the weighed barium titanate, barium zirconate, barium carbonate, and titanium oxide was converted into the chemical formula $Ba_a(Ti_{1-x}Zr_x)O_3$. Manganese dioxide and bismuth oxide were weighed so that the proportions of an Mn element as the first auxiliary component and a Bi element as the second auxiliary component were as illustrated in Table 1 relative to 1 mole of the compound represented by the chemical formula after the conversion. Further, silicon dioxide and boron oxide were weighed so that the proportions of the amounts of contained Si and B as the third auxiliary components were as illustrated in Table 1 in terms of metal relative to 100 parts by weight of the compound represented by the chemical formula $Ba_a(Ti_{1-x}Zr_x)O_3$ after the conversion.

These weighed powders were mixed together by dry blending for 24 hours, using a ball mill. Then, 3 parts by weight of a PVA binder was attached to the surface of the mixed powder using a spray dryer apparatus, thereby granulating the mixed powder.

Next, a metal mold was filled with the obtained granulated powder, and a molding pressure of 200 MPa was applied to the granulated powder using a press molding machine, thereby preparing a disk-shaped compact.

The obtained compact was placed in an electric furnace, held for 4 hours under the condition of a maximum sintering temperature $T_{max}$ as illustrated in Table 1, and sintered in the atmosphere for a total of 24 hours, thereby obtaining a ceramic formed of the piezoelectric material according to the present invention.

Similarly to Example 1, the average equivalent circular diameter and the relative density were evaluated. The results are illustrated in Table 2.

Further, similarly to Example 1, the composition was analyzed. In all the piezoelectric materials, the weighed composition of Ba, Ti, Zr, Mn, Bi, Si, and B coincided with the composition after sintering.

(Metal Oxide Materials of Comparative Examples 1 to 12)

Metal oxide materials for comparison were prepared by processes similar to those of Example 1, according to the proportions of the main component, the first auxiliary component, the second auxiliary component, and the third auxiliary components, the molar ratio a of the A site to the B site, and the condition of the maximum sintering temperature $T_{max}$, as illustrated in Table 1.

Similarly to Example 1, the average equivalent circular diameter and the relative density were evaluated. The results are illustrated in Table 2.

Further, similarly to Example 1, the composition was analyzed. In all the metal oxide materials, the weighed composition of Ba, Ti, Zr, Mn, Bi, Si, and B coincided with the composition after sintering.

TABLE 1

| | Main Component | | | First Auxiliary Component | Second Auxiliary Component | Third Auxiliary Component | | | Maximum Sintering Temperature |
|---|---|---|---|---|---|---|---|---|---|
| | Zr x | Ti 1 − x | A/B a | Mn mol | Bi mol | Si Parts by Weight | B Parts by Weight | Total Parts by Weight | $T_{max}$ ° C. |
| Example 1 | 0.040 | 0.960 | 1.0005 | 0.015 | 0.00200 | 0.0670 | 0.0330 | 0.1000 | 1200 |
| Example 2 | 0.060 | 0.940 | 0.9985 | 0.010 | 0.00100 | 0.0670 | 0.0330 | 0.1000 | 1250 |
| Example 3 | 0.060 | 0.940 | 1.0005 | 0.010 | 0.00100 | 0.0670 | 0.0330 | 0.1000 | 1250 |
| Example 4 | 0.050 | 0.950 | 0.9985 | 0.010 | 0.00200 | 0.0670 | 0.0330 | 0.1000 | 1250 |
| Example 5 | 0.040 | 0.960 | 0.9985 | 0.010 | 0.00200 | 0.0670 | 0.0330 | 0.1000 | 1200 |
| Example 6 | 0.020 | 0.980 | 0.9985 | 0.010 | 0.00200 | 0.0670 | 0.0330 | 0.1000 | 1200 |
| Example 7 | 0.130 | 0.870 | 0.9985 | 0.005 | 0.00200 | 0.0670 | 0.0330 | 0.1000 | 1250 |
| Example 8 | 0.100 | 0.900 | 0.9985 | 0.005 | 0.00200 | 0.0670 | 0.0330 | 0.1000 | 1250 |
| Example 9 | 0.040 | 0.960 | 0.9860 | 0.005 | 0.00200 | 0.0670 | 0.0330 | 0.1000 | 1200 |

TABLE 1-continued

| | Main Component | | | First Auxiliary Component | Second Auxiliary Component | Third Auxiliary Component | | | Maximum Sintering Temperature |
|---|---|---|---|---|---|---|---|---|---|
| | Zr x | Ti 1 − x | A/B a | Mn mol | Bi mol | Si Parts by Weight | B Parts by Weight | Total Parts by Weight | $T_{max}$ °C. |
| Example 10 | 0.040 | 0.960 | 1.0200 | 0.005 | 0.00200 | 0.0670 | 0.0330 | 0.1000 | 1200 |
| Example 11 | 0.040 | 0.960 | 0.9985 | 0.005 | 0.00200 | 0.0010 | 0.0000 | 0.0010 | 1250 |
| Example 12 | 0.040 | 0.960 | 0.9985 | 0.005 | 0.00200 | 3.6700 | 1.3300 | 4.0000 | 1200 |
| Example 13 | 0.040 | 0.960 | 0.9985 | 0.005 | 0.00200 | 0.0005 | 0.0000 | 0.0005 | 1350 |
| Example 14 | 0.040 | 0.960 | 0.9985 | 0.005 | 0.00200 | 0.0000 | 0.0000 | 0.0000 | 1400 |
| Example 15 | 0.040 | 0.960 | 0.9985 | 0.005 | 0.00200 | 4.3300 | 1.6700 | 5.0000 | 1300 |
| Example 16 | 0.040 | 0.960 | 0.9955 | 0.002 | 0.00042 | 0.0670 | 0.0330 | 0.1000 | 1200 |
| Example 17 | 0.040 | 0.960 | 0.9860 | 0.002 | 0.00200 | 0.0670 | 0.0330 | 0.1000 | 1200 |
| Example 18 | 0.040 | 0.960 | 0.9900 | 0.002 | 0.00200 | 0.0670 | 0.0330 | 0.1000 | 1200 |
| Example 19 | 0.040 | 0.960 | 0.9920 | 0.002 | 0.00200 | 0.0670 | 0.0330 | 0.1000 | 1200 |
| Example 20 | 0.040 | 0.960 | 0.9955 | 0.002 | 0.00200 | 0.0670 | 0.0330 | 0.1000 | 1200 |
| Example 21 | 0.040 | 0.960 | 0.9965 | 0.002 | 0.00200 | 0.0670 | 0.0330 | 0.1000 | 1200 |
| Example 22 | 0.040 | 0.960 | 0.9975 | 0.002 | 0.00200 | 0.0670 | 0.0330 | 0.1000 | 1200 |
| Example 23 | 0.040 | 0.960 | 0.9985 | 0.002 | 0.00200 | 0.0670 | 0.0330 | 0.1000 | 1200 |
| Example 24 | 0.040 | 0.960 | 0.9995 | 0.002 | 0.00200 | 0.0670 | 0.0330 | 0.1000 | 1250 |
| Example 25 | 0.040 | 0.960 | 1.0005 | 0.002 | 0.00200 | 0.0670 | 0.0330 | 0.1000 | 1250 |
| Example 26 | 0.040 | 0.960 | 1.0015 | 0.002 | 0.00200 | 0.0670 | 0.0330 | 0.1000 | 1250 |
| Example 27 | 0.040 | 0.960 | 1.0100 | 0.002 | 0.00200 | 0.0670 | 0.0330 | 0.1000 | 1250 |
| Example 28 | 0.040 | 0.960 | 1.0200 | 0.002 | 0.00200 | 0.0670 | 0.0330 | 0.1000 | 1250 |
| Example 29 | 0.040 | 0.960 | 0.9955 | 0.002 | 0.00850 | 0.0670 | 0.0330 | 0.1000 | 1200 |
| Comparative Example 1 | 0.140 | 0.860 | 0.9985 | 0.005 | 0.00100 | 0.0670 | 0.0330 | 0.1000 | 1250 |
| Comparative Example 2 | 0.060 | 0.940 | 0.9985 | 0.010 | 0.00000 | 0.0670 | 0.0330 | 0.1000 | 1250 |
| Comparative Example 3 | 0.050 | 0.950 | 0.9985 | 0.010 | 0.00000 | 0.0670 | 0.0330 | 0.1000 | 1250 |
| Comparative Example 4 | 0.040 | 0.960 | 0.9840 | 0.005 | 0.00200 | 0.0670 | 0.0330 | 0.1000 | 1200 |
| Comparative Example 5 | 0.040 | 0.960 | 1.0210 | 0.005 | 0.00200 | 0.0670 | 0.0330 | 0.1000 | 1200 |
| Comparative Example 6 | 0.040 | 0.960 | 0.9955 | 0.001 | 0.00200 | 0.0670 | 0.0330 | 0.1000 | 1200 |
| Comparative Example 7 | 0.040 | 0.960 | 0.9985 | 0.018 | 0.00200 | 0.0670 | 0.0330 | 0.1000 | 1200 |
| Comparative Example 8 | 0.040 | 0.960 | 0.9955 | 0.005 | 0.00040 | 0.0670 | 0.0330 | 0.1000 | 1200 |
| Comparative Example 9 | 0.040 | 0.960 | 0.9955 | 0.005 | 0.00900 | 0.0670 | 0.0330 | 0.1000 | 1200 |
| Comparative Example 10 | 0.030 | 0.970 | 0.9985 | 0.010 | 0.00000 | 0.0670 | 0.0330 | 0.1000 | 1200 |
| Comparative Example 11 | 0.020 | 0.980 | 0.9985 | 0.010 | 0.00000 | 0.0670 | 0.0330 | 0.1000 | 1200 |
| Comparative Example 12 | 0.015 | 0.9985 | 0.9985 | 0.010 | 0.00200 | 0.0670 | 0.0330 | 0.1000 | 1200 |

TABLE 2

| | Equivalent Circular Diameter μm | Relative Density % |
|---|---|---|
| Example 1 | 3.2 | 98.9 |
| Example 2 | 3.1 | 98.5 |
| Example 3 | 1.2 | 98.3 |
| Example 4 | 2.8 | 98.7 |
| Example 5 | 3.4 | 99.0 |
| Example 6 | 4.1 | 98.9 |
| Example 7 | 1.0 | 93.4 |
| Example 8 | 1.0 | 93.6 |
| Example 9 | 8.0 | 99.1 |
| Example 10 | 0.5 | 94.2 |
| Example 11 | 3.9 | 99.1 |
| Example 12 | 3.9 | 95.3 |
| Example 13 | 3.9 | 98.7 |
| Example 14 | 4.1 | 99.5 |
| Example 15 | 4.1 | 98.6 |
| Example 16 | 3.3 | 97.7 |
| Example 17 | 7.6 | 98.7 |
| Example 18 | 7.2 | 99.1 |
| Example 19 | 5.6 | 98.9 |
| Example 20 | 3.1 | 99.3 |
| Example 21 | 2.4 | 98.7 |
| Example 22 | 2.1 | 98.6 |
| Example 23 | 1.7 | 98.2 |
| Example 24 | 1.8 | 97.9 |
| Example 25 | 1.2 | 97.6 |
| Example 26 | 1.1 | 97.2 |
| Example 27 | 0.7 | 94.0 |
| Example 28 | 0.7 | 93.8 |
| Example 29 | 2.8 | 99.0 |
| Comparative Example 1 | 0.4 | 91.2 |
| Comparative Example 2 | 3.5 | 97.9 |
| Comparative Example 3 | 3.5 | 99.1 |

TABLE 2-continued

|  | Equivalent Circular Diameter μm | Relative Density % |
|---|---|---|
| Comparative Example 4 | 15.1 | 97.5 |
| Comparative Example 5 | 0.3 | 92.2 |
| Comparative Example 6 | 3.1 | 98.9 |
| Comparative Example 7 | 2.4 | 98.3 |
| Comparative Example 8 | 2.3 | 96.5 |
| Comparative Example 9 | 2.1 | 96.1 |
| Comparative Example 10 | 2.4 | 99.0 |
| Comparative Example 11 | 2.9 | 98.3 |
| Comparative Example 12 | 3.7 | 98.4 |

(Production of Piezoelectric Element)

Next, the piezoelectric element according to the present invention was produced.

(Piezoelectric Elements of Examples 1 to 29)

Piezoelectric elements were produced using the piezoelectric materials of Examples 1 to 29.

Gold electrodes, each having a thickness of 400 nm, were formed on both front and back surfaces of the disk-shaped ceramic by direct-current (DC) sputtering. Between each electrode and the ceramic, a titanium film having a thickness of 30 nm was formed as an adhesion layer. The ceramic with the electrodes was cut to produce a rectangular piezoelectric element having a size of 10 mm×2.5 mm×0.5 mm.

The piezoelectric element was placed on a hot plate, the piezoelectric element was heated so that the temperature of the piezoelectric element surface would be 100° C., and an electric field of 14 kV/cm was applied to the heated piezoelectric element for 30 minutes. After the piezoelectric element was cooled to 25° C. while retaining the electric field, the application of the electric field was ended. Through such a procedure, a polarization treatment was performed on the piezoelectric element.

(Piezoelectric Elements of Comparative Examples 1 to 12)

Next, elements for comparison were produced and subjected to a polarization treatment by a method similar to those of Examples 1 to 29, using the metal oxide materials for comparison of Comparative Examples 1 to 12.

(Evaluations of Properties of Piezoelectric Element)

Regarding the piezoelectric elements produced using the piezoelectric materials of Examples 1 to 29 and the elements for comparison produced using the metal oxide materials of Comparative Examples 1 to 12, a piezoelectric constant $d_{31}$ and a mechanical quality factor Qm, at a room temperature of 25° C., of each piezoelectric element subjected to the polarization treatment were evaluated. Further, the temperature dependence of the dielectric loss tangent was measured using an impedance analyzer. The results are illustrated in table 3. In table 3, "–" in Comparative Example 5 indicates that a significant result was not obtained regarding the evaluation item because the resistivity of the element was low and the element was not able to be sufficiently subjected to the polarization treatment.

The piezoelectric constant $d_{31}$ and the mechanical quality factor Qm were obtained by the resonance-antiresonance method. If the piezoelectric constant $d_{31}$ is small, a large electric field is required to drive the device. Thus, such a piezoelectric constant is not suitable for driving the device. The piezoelectric constant $d_{31}$ is preferably 100 pm/V or more, and more preferably 140 pm/V or more.

(Evaluations of Phase Transition Temperature $T_{to}$ and Curie Temperature $T_c$ of Piezoelectric Element)

Next, regarding the piezoelectric elements of Examples 1 to 29 and the elements for comparison of Comparative Examples 1 to 12, the phase transition temperature $T_{to}$ and the Curie temperature $T_c$ were evaluated. The phase transition temperature $T_{to}$ and the Curie temperature $T_c$ were calculated by measuring the capacitance of a sample using an impedance analyzer (4194A, manufactured by Agilent Technologies, Inc.) while changing the temperature of the sample. The phase transition temperature $T_{to}$ is a temperature at which, when the temperature of the sample was once lowered from room temperature to −100° C. and then raised to 150° C., the crystal system changed from tetragonal to orthorhombic. The phase transition temperature $T_{to}$ was defined as a temperature at which, when the dielectric constant was measured while cooling the sample, the value obtained by differentiating the measured dielectric constant by the sample temperature was maximum. The Curie temperature $T_c$ is a temperature at which the dielectric constant was a local maximum near the phase transition temperature between a ferroelectric phase (a tetragonal phase) and a paraelectric phase (a cubic phase). The Curie temperature $T_c$ was defined as a temperature at which, when the dielectric constant was measured while heating the sample, the value of the measured dielectric constant was a local maximum. The results are illustrated in table 3.

TABLE 3

|  | $T_{to}$ ° C. | $T_c$ ° C. | $d_{31}$ pm/V | Qm | Dielectric Loss Tangent |
|---|---|---|---|---|---|
| Example 1 | 26 | 114 | 124 | 1265 | 0.0056 |
| Example 2 | 56 | 106 | 105 | 1237 | 0.0051 |
| Example 3 | 56 | 100 | 95 | 1336 | 0.0048 |
| Example 4 | 34 | 108 | 119 | 978 | 0.0050 |
| Example 5 | 24 | 114 | 128 | 876 | 0.0057 |
| Example 6 | 10 | 126 | 111 | 1137 | 0.0041 |
| Example 7 | 70 | 78 | 86 | 439 | 0.0038 |
| Example 8 | 56 | 86 | 114 | 554 | 0.0046 |
| Example 9 | 24 | 114 | 120 | 594 | 0.0053 |
| Example 10 | 18 | 114 | 112 | 243 | 0.0028 |
| Example 11 | 24 | 114 | 139 | 757 | 0.0034 |
| Example 12 | 24 | 114 | 124 | 683 | 0.0034 |
| Example 13 | 24 | 114 | 148 | 698 | 0.0036 |
| Example 14 | 24 | 114 | 152 | 722 | 0.0038 |
| Example 15 | 24 | 114 | 142 | 589 | 0.0054 |
| Example 16 | 50 | 114 | 106 | 387 | 0.0040 |
| Example 17 | 24 | 114 | 132 | 489 | 0.0053 |
| Example 18 | 24 | 114 | 147 | 473 | 0.0051 |
| Example 19 | 24 | 114 | 149 | 523 | 0.0049 |
| Example 20 | 24 | 114 | 156 | 583 | 0.0044 |
| Example 21 | 24 | 114 | 152 | 481 | 0.0045 |
| Example 22 | 22 | 114 | 148 | 342 | 0.0030 |
| Example 23 | 20 | 114 | 129 | 289 | 0.0031 |
| Example 24 | 20 | 114 | 128 | 205 | 0.0036 |
| Example 25 | 18 | 114 | 126 | 189 | 0.0027 |
| Example 26 | 18 | 114 | 125 | 165 | 0.0024 |
| Example 27 | 16 | 114 | 121 | 160 | 0.0023 |
| Example 28 | 16 | 114 | 115 | 155 | 0.0023 |
| Example 29 | −8 | 114 | 97 | 667 | 0.0043 |
| Comparative Example 1 | 72 | 74 | 73 | 281 | 0.0046 |
| Comparative Example 2 | 57 | 102 | 86 | 1031 | 0.0067 |
| Comparative Example 3 | 52 | 110 | 85 | 2121 | 0.0065 |
| Comparative Example 4 | 24 | 114 | 82 | 245 | 0.0068 |

TABLE 3-continued

|  | $T_{to}$ °C. | $T_c$ °C. | $d_{31}$ pm/V | Qm | Dielectric Loss Tangent |
|---|---|---|---|---|---|
| Comparative Example 5 | 20 | 114 | — | — | — |
| Comparative Example 6 | 24 | 114 | 125 | 110 | 0.0120 |
| Comparative Example 7 | 26 | 114 | 121 | 320 | 0.0160 |
| Comparative Example 8 | 6 | 114 | 81 | 215 | 0.0065 |
| Comparative Example 9 | −14 | 114 | 58 | 523 | 0.0086 |
| Comparative Example 10 | 38 | 122 | 92 | 877 | 0.0067 |
| Comparative Example 11 | 28 | 126 | 95 | 916 | 0.0055 |
| Comparative Example 12 | 12 | 126 | 84 | 946 | 0.0048 |

The results of table 3 will be described.

In Comparative Example 1, the value of "x" is 0.140, which is greater than 0.130. The results were as follows. The piezoelectric constant $d_{31}$ at room temperature (25° C.) was 73, which was smaller than those of Examples 1 to 29.

Further, in Comparative Example 12, the value of "x" is 0.015, which is smaller than 0.020. The results were as follows. The piezoelectric constant $d_{31}$ at room temperature (25° C.) was 84, which was smaller than those of Examples 1 to 29.

In Comparative Example 4, the value of "a" is smaller than 0.9860. The results were as follows. The average equivalent circular diameter was 15.1 μm, which was larger than those of Examples 1 to 29, and abnormal grain growth occurred. The mechanical strength of the element was evaluated by a three-point bending test, using a tension-compression test apparatus (trade name: Tensilon RTC-1250A, manufactured by Orientec Co., Ltd.). As a result, the mechanical strength of the element of Comparative Example 4 was 25 MPa, which was significantly lower than those of the piezoelectric elements of Examples 1 to 29, which were 45 MPa or more.

In Comparative Example 5, the value of "a" is greater than 1.0200. The results were as follows. The grain growth was excessively suppressed as compared to Examples 1 to 29, and the relative density was low, namely 92.2%. As a result, the resistivity of the element of Comparative Example 5 was low. Thus, a sufficient electric field was not able to be applied to the element, and the element was not able to be subjected to a polarization treatment.

In Comparative Example 6, the amount of the contained Mn is 0.001 moles, which is smaller than 0.002 moles. The results were as follows. The mechanical quality factor Qm was 110, which was smaller than those of Examples 1 to 29. As a result, when the element was driven as a resonance device, the power consumption increased.

In Comparative Example 7, the amount of the contained Mn is 0.018 moles, which is greater than 0.015 moles. The results were as follows. The dielectric loss tangent was 0.0160, which was greater than those of Examples 1 to 29, which were smaller than 0.006. As a result, when the element was driven as a resonance device, the power consumption increased.

In Comparative Example 8, the amount of the contained Bi is 0.00040 moles, which is smaller than 0.00042 moles. The results were as follows. The piezoelectric constant $d_{31}$ was 81 pm/V, which was smaller than those of Examples 1 to 29. Further, the dielectric loss tangent was 0.0065, which was greater than those of Examples 1 to 29, which were smaller than 0.006. As a result, when the element was driven as a resonance device, the power consumption increased.

In Comparative Example 9, the amount of the contained Bi is 0.00900 moles, which is greater than 0.00850 moles. The results were as follows. The piezoelectric constant $d_{31}$ was 58 pm/V, which was smaller than those of Examples 1 to 29. The dielectric loss tangent was 0.0086, which was greater than those of Examples 1 to 29, which were smaller than 0.006. As a result, when the element was driven as a resonance device, the power consumption increased.

In each of Comparative Examples 2, 3, 10, and 11, the amount of the contained Bi is 0 moles (that is, below the detection limit). The results were as follows. The respective piezoelectric constants $d_{31}$ were 86 pm/V, 85 pm/V, 92 pm/V, and 95 pm/V. The respective phase transition temperatures $T_{to}$ were 57° C., 52° C., 38° C., and 28° C.

The above four Comparative Examples 2, 3, 10, and 11 and among the examples, those clearly different from the Comparative Examples 2, 3, 10, and 11 for compositional reasons are comparatively considered.

As compared to Comparative Example 2, in Example 2, the phase transition temperature $T_{to}$ is almost equal to that of Comparative Example 2, and the amount of the contained Mn is 0.010 moles. Then, in Example 2, the piezoelectric constant $d_{31}$ is 105 pm/V, which is 20% or more greater than the value of the piezoelectric constant $d_{31}$ of Comparative Example 2, namely 86 pm/V.

Further, as compared to Comparative Example 3, in Example 3, the phase transition temperature $T_{to}$ is almost equal to that of Comparative Example 3, and the amount of the contained Mn is 0.010 moles. Then, in Example 3, the piezoelectric constant $d_{31}$ is 95 pm/V, which is 10% or more greater than that of Comparative Example 3, namely 85 pm/V.

Further, as compared to Comparative Example 10, in Example 4, the phase transition temperature $T_{to}$ is almost equal to that of Comparative Example 10, and the amount of the contained Mn is 0.010 moles. Then, in Example 4, the piezoelectric constant $d_{31}$ is 119 pm/V, which is 20% or more greater than that of Comparative Example 10, namely 92 pm/V.

Further, as compared to Comparative Example 11, in Example 5, the phase transition temperature $T_{to}$ is almost equal to that of Comparative Example 11, and the amount of the contained Mn is 0.010 moles. Then, in Example 5, the piezoelectric constant $d_{31}$ is 128 pm/V, which is 20% or more greater than that of Comparative Example 11, namely 95 pm/V.

The amount of the contained Mn is a parameter affecting the mechanical quality factor Qm of the piezoelectric material. Generally, it is said that the mechanical quality factor Qm and the piezoelectric constant have a trade-off relationship. Thus, when the piezoelectric properties are compared, the values of the mechanical quality factors Qm may be approximated to some extent. It was understood that if, with this point in mind, the piezoelectric properties were compared under the conditions that the amounts of the contained Mn were equal and the phase transition temperatures $T_{to}$ were almost equal, the piezoelectric constant $d_{31}$ of a sample containing Bi increased near room temperature.

In Example 13, the total amount of the contained Si and B is 0.0005 parts by weight, which is smaller than 0.001 parts by weight. The results were as follows. The state of sintering was insufficient at a maximum sintering temperature $T_{max}$ of 1200° C. and 1250° C. Thus, the maximum sintering temperature $T_{max}$ required 1350° C. At this time, the relative density was high, namely 98.7%, and the piezoelectric constant $d_{31}$ was great, namely 148 pm/V.

In Example 15, the total amount of the contained Si and B is 5.000 parts by weight, which is greater than 4.000 parts by weight. The results were as follows. The state of sintering was insufficient at a maximum sintering temperature $T_{max}$ of 1200° C. and 1250° C. Thus, the maximum sintering temperature $T_{max}$ required 1300° C. At this time, the relative density was high, namely 98.6%, and the piezoelectric constant $d_{31}$ was great, namely 142 pm/V.

Further, Comparative Examples 6 and 7 demonstrated high piezoelectric properties among the comparative examples. Then, in each of Comparative Examples 6 and 7, the dielectric loss tangent was great, namely 0.008 or more. As a result, when the element was driven as a resonance device, the power consumption increased. Thus, the element was not able to be applied in terms of practicality.

(Production and Evaluation of Multilayered Piezoelectric Element)

Next, the multilayered piezoelectric element according to the present invention was produced.

Example 30

Raw materials corresponding to a composition $(Ba_{0.9955}(Ti_{0.9960}Zr_{0.040})O_3)$, which is represented by the general formula (1) of $Ba_a(Ti_{1-x}Zr_x)O_3$, where x=0.040 and a=0.9955, were weighed in the following manner.

Raw material powders of barium titanate having a purity of 99.99% or more and barium zirconate having a purity of 99.99% or more were prepared as the raw materials of the main component and weighed so that the proportions of Ba, Ti, and Zr resulted in the composition $Ba_{0.9955}(Ti_{0.9960}Zr_{0.040})O_3$. Further, barium carbonate and titanium oxide were used to adjust "a" indicating the ratio of the molar amount of Ba at the A site to the molar amounts of Ti and Zr at the B site.

Manganese dioxide was weighed so that the amount of an Mn element contained as the first auxiliary component was 0.002 moles relative to 1 mole of the composition $(Ba_{0.9955}(Ti_{0.9960}Zr_{0.040})O_3)$.

Bismuth oxide was weighed so that the amount of a Bi element contained as the second auxiliary component was 0.00200 moles relative to 1 mole of the composition $(Ba_{0.9955}(Ti_{0.9960}Zr_{0.040})O_3)$.

Silicon dioxide was weighed so that as one of the third auxiliary components, Si was 0.0670 parts by weight in terms of metal relative to 100 parts by weight of the composition $(Ba_{0.9955}(Ti_{0.9960}Zr_{0.040})O_3)$. Boron oxide was weighed so that as one of the third auxiliary components, B was 0.0330 parts by weight in terms of metal relative to 100 parts by weight of the composition $(Ba_{0.9955}(Ti_{0.9960}Zr_{0.040})O_3)$.

PVB was added to and mixed with these weighed powders. Then, the mixture was formed into a sheet by a doctor blade method, thereby obtaining a green sheet having a thickness of 50 µm.

A conductive paste for internal electrodes was printed on the green sheet. As the conductive paste, a 70% Ag—30% Pd alloy (Ag/Pd=2.33) paste was used. Nine green sheets to which the conductive paste was applied were stacked together, and the resulting laminate was sintered for 4 hours under the condition of 1200° C. to obtain a sintered body.

The composition of a piezoelectric material portion of the thus obtained sintered body was evaluated by an ICP emission spectroscopic analysis. As a result, it was understood that the piezoelectric material included as the main component a metal oxide that can be represented by a chemical formula $Ba_{0.9955}(Ti_{0.9960}Zr_{0.040})O_3$, and 0.002 moles of the Mn element and 0.00200 moles of the Bi element were contained relative to 1 mole of the main component. Further, it was also understood that 0.00670 parts by weight of Si and 0.00330 parts by weight of B were contained relative to 100 parts by weight of the main component. The weighed composition of Ba, Ti, Zr, Mn, Bi, Si, and B coincided with the composition after the sintering.

The sintered body was cut into a size of 10 mm×2.5 mm, and then, the side surfaces of the cut sintered body were polished. A pair of external electrodes (a first electrode and a second electrode) for alternately short-circuiting internal electrodes was formed by Au sputtering, thereby producing a multilayered piezoelectric element as illustrated in FIG. 2B.

The multilayered piezoelectric element includes nine piezoelectric material layers and eight internal electrode layers. When the internal electrodes of the obtained multilayered piezoelectric element were observed, electrode materials containing Ag—Pd were formed alternately with the piezoelectric materials.

A polarization treatment was performed on a sample prior to the evaluation of the piezoelectric properties. Specifically, the sample was heated to 100° C. to 150° C. on a hot plate, an electric field of 14 kV/cm was applied to between the first and second electrodes for 30 minutes, and after the sample was cooled to room temperature while retaining the electric field, the application of the electric field was ended.

When the piezoelectric properties of the obtained multilayered piezoelectric element were evaluated, it was understood that even with the multilayered structure, the multilayered piezoelectric element had insulation properties and piezoelectric properties equivalent to those of the ceramic of Example 17.

Further, also regarding a multilayered piezoelectric element produced similarly except that Ni and Cu were used for internal electrodes and the multilayered piezoelectric element was sintered in a low-oxygen atmosphere, equivalent piezoelectric properties were obtained.

Comparative Example 13

A multilayered piezoelectric element was produced by processes similar to those of Example 30. However, the composition was similar to that of Comparative Example 11, the sintering temperature was 1200° C., and internal electrodes contained a 95% Ag-5% Pd alloy (Ag/Pd=19). The internal electrodes were observed using an SEM. As a result, the internal electrodes were melted and dotted in an insular manner. Thus, there was no electrical continuity between the internal electrodes, and therefore, the multilayered piezoelectric element was not able to be polarized. Consequently, the piezoelectric properties were not able to be evaluated.

Comparative Example 14

A multilayered piezoelectric element was produced similarly to Comparative Example 13 except that internal electrodes contained a 5% Ag-95% Pd alloy (Ag/Pd=0.05). The internal electrodes were observed using an SEM. Peeling was found at the boundary between an electrode material containing Ag—Pd and a piezoelectric material layer. When the multilayered piezoelectric element was polarized, a sufficient electric field was not able to be applied, and therefore, the multilayered piezoelectric element was not able to be polarized. Consequently, the piezoelectric properties were not able to be evaluated.

Example 31

A liquid discharge head as illustrated in FIGS. 3A and 3B was produced using the piezoelectric element including the piezoelectric material of Example 20. The discharge of ink according to an input electric signal was confirmed.

Example 32

A liquid discharge apparatus as illustrated in FIG. 4 was produced using the liquid discharge head of Example 31. The discharge of ink according to an input electric signal was confirmed on an object.

Example 33

An ultrasonic motor as illustrated in FIG. 6A was produced using the piezoelectric element including the piezoelectric material of Example 20. The rotation of the motor according to the application of an alternating voltage was confirmed.

Example 34

An optical device as illustrated in FIGS. 7A and 7B was produced using the ultrasonic motor of Example 33. An autofocus operation according to the application of an alternating voltage was confirmed.

Example 35

A dust removing device as illustrated in FIGS. 9A and 9B was produced using the piezoelectric element including the piezoelectric material of Example 20. When plastic beads were scattered and an alternating voltage was applied, an excellent dust removing efficiency was confirmed.

Example 36

An imaging apparatus as illustrated in FIG. 12 was produced using the dust removing device of Example 35. When the imaging apparatus was operated, dust on the surface of the imaging unit was removed effectively, and an image without dust defects was obtained.

Example 37

An electronic device as illustrated in FIG. 14 was produced using the piezoelectric element formed of the piezoelectric material of Example 20. A loudspeaker operation according to the application of an alternating voltage was confirmed.

Example 38

A liquid discharge head as illustrated in FIGS. 3A and 3B was produced using the multilayered piezoelectric element of Example 30. The discharge of ink according to an input electric signal was confirmed.

Example 39

A liquid discharge apparatus as illustrated in FIG. 4 was produced using the liquid discharge head of Example 38. The discharge of ink according to an input electric signal was confirmed on an object.

Example 40

An ultrasonic motor as illustrated in FIG. 6B was produced using the multilayered piezoelectric element of Example 30. The rotation of the motor according to the application of an alternating voltage was confirmed.

Example 41

An optical device as illustrated in FIGS. 7A and 7B was produced using the ultrasonic motor of Example 40. An autofocus operation according to the application of an alternating voltage was confirmed.

Example 42

A dust removing device as illustrated in FIGS. 9A and 9B was produced using the multilayered piezoelectric element of Example 30. When plastic beads were scattered and an alternating voltage was applied, an excellent dust removing efficiency was confirmed.

Example 43

An imaging apparatus as illustrated in FIG. 12 was produced using the dust removing device of Example 42. When the imaging apparatus was operated, dust on the surface of the imaging unit was removed effectively, and an image without dust defects was obtained.

Example 44

An electronic device illustrated in FIG. 14 was produced using the multilayered piezoelectric element of Example 30. A loudspeaker operation according to the application of an alternating voltage was confirmed.

The piezoelectric material according to the present invention has excellent piezoelectric properties in the room temperature range. Further, the piezoelectric material does not contain lead, and therefore has little environmental load. Thus, the piezoelectric material according to the present invention can be used without any problem even for a device using many piezoelectric materials, such as a liquid discharge head, an ultrasonic motor, or a dust removing device.

According to an exemplary embodiment of the present invention, it is possible to provide a lead-free piezoelectric material having more excellent piezoelectric properties in the room temperature range.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-113121 filed May 30, 2014, which is hereby incorporated by reference herein in its entirety.

What is claimed is:

1. A piezoelectric material comprising:
a perovskite metal oxide represented by following general formula (1);
Mn; and
a trivalent Bi,
wherein an amount of the Mn is 0.0020 moles or more and 0.0150 moles or less relative to 1 mole of the metal oxide, and an amount of the Bi is 0.00042 moles or more and 0.00850 moles or less relative to 1 mole of the metal oxide $$Ba_a(Ti_{1-x}Zr_x)O_3 \tag{1}$$

where $0.02 \leq x \leq 0.13$ and $0.986 \leq a \leq 1.02$, and
wherein a relative density of the piezoelectric material is 93% or more and 100% or less.

2. The piezoelectric material according to claim 1, further comprising at least one of Si and B,
wherein an amount of the at least one of Si and B is 0.001 parts by weight or more and 4.000 parts by weight or less in terms of metal relative to 100 parts by weight of the perovskite metal oxide represented by the general formula (1).

3. The piezoelectric material according to claim 1, wherein a tetragonal-orthorhombic phase transition temperature $T_{to}$ is 10° C. or more.

4. The piezoelectric material according to claim 1, wherein an average equivalent circular diameter of crystal grains forming the piezoelectric material is 500 nm or more and 10 µm or less.

5. The piezoelectric material according to claim 1, wherein a dielectric loss tangent, at a frequency of 1 kHz, of the piezoelectric material is 0.006 or less.

6. A piezoelectric element comprising:
a first electrode;
a piezoelectric material portion; and
a second electrode,
wherein a piezoelectric material of the piezoelectric material portion includes:
a perovskite metal oxide represented by following general formula (1);
Mn; and
Bi,
wherein an amount of the Mn is 0.0020 moles or more and 0.0150 moles or less relative to 1 mole of the metal oxide, and an amount of the Bi is 0.00042 moles or more and 0.00850 moles or less relative to 1 mole of the metal oxide $$Ba_a(Ti_{1-x}Zr_x)O_3 \tag{1}$$

where $0.02 \leq x \leq 0.13$ and $0.986 \leq a \leq 1.02$.

7. A method for manufacturing a piezoelectric element, the method comprising:
providing the piezoelectric material according to claim 1 with a first electrode and a second electrode;
applying a voltage at a temperature at which the piezoelectric material becomes tetragonal; and
cooling the piezoelectric material to a temperature at which the piezoelectric material becomes orthorhombic, while retaining the voltage.

8. The piezoelectric element according to claim 6, further comprising a plurality of piezoelectric material layers including the piezoelectric material portion and a plurality of electrode layers including the first electrode and the second electrode electrode, the piezoelectric material layers and the electrode layers being alternately stacked.

9. The piezoelectric element according to claim 8, wherein the plurality of electrode layers includes an internal electrode containing Ag and Pd, and
wherein a weight ratio of M1/M2 is 0.25 M1/M2≤4.0 where a weight of the contained Ag is M1 and a weight of the contained Pd is M2.

10. The piezoelectric element according to claim 8, wherein the plurality of electrode layers includes an internal electrode containing at least one of Ni and Cu.

11. A liquid discharge head comprising:
a liquid chamber including a vibrating unit provided with the piezoelectric element according to claim 6; and
a discharge port communicating with the liquid chamber.

12. A liquid discharge apparatus comprising:
a stage for an object; and
the liquid discharge head according to claim 11.

13. An ultrasonic motor comprising at least:
a vibrating member provided with the piezoelectric element according to claim 6; and
a moving member in contact with the vibrating member.

14. An optical device comprising a driving unit provided with the ultrasonic motor according to claim 13.

15. An oscillatory device comprising a vibrating member including a diaphragm provided with the piezoelectric element according to claim 6.

16. A dust removing device comprising a vibrating unit provided with the oscillatory device according to claim 15.

17. An imaging apparatus comprising at least:
the dust removing device according to claim 16; and
an image sensor unit,
wherein the diaphragm of the dust removing device is provided on a light-receiving surface side of the image sensor unit.

18. An electronic device comprising a piezoelectric acoustic component provided with the piezoelectric element according to claim 6.

19. The piezoelectric material according to claim 1, wherein the piezoelectric material contains 90 mole percent of the metal oxide as a main component.

20. The piezoelectric material according to claim 19, wherein the piezoelectric material contains 95 mole percent of the metal oxide as the main component.

21. The piezoelectric element according to claim 6, wherein the Bi is trivalent Bi.

* * * * *